US012347720B2

(12) United States Patent
Jung et al.

(10) Patent No.: US 12,347,720 B2
(45) Date of Patent: Jul. 1, 2025

(54) APPARATUS FOR TREATING SUBSTRATE

(71) Applicant: SEMES CO., LTD., Cheonan-si (KR)

(72) Inventors: Jin Woo Jung, Cheonan-si (KR); Jin Mo Jae, Cheonan-si (KR); Sang Min Lee, Seoul (KR); Young Hun Lee, Cheonan-si (KR); Yong Hyun Choi, Cheonan-si (KR); Yong Joon Im, Yongin-si (KR); Seung Hoon Oh, Cheonan-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 229 days.

(21) Appl. No.: 17/971,734

(22) Filed: Oct. 24, 2022

(65) Prior Publication Data
US 2023/0129923 A1 Apr. 27, 2023

(30) Foreign Application Priority Data

Oct. 25, 2021 (KR) .................. 10-2021-0142881

(51) Int. Cl.
*H01L 21/687* (2006.01)
*B08B 3/04* (2006.01)
(Continued)

(52) U.S. Cl.
CPC ........... *H01L 21/6875* (2013.01); *B08B 3/04* (2013.01); *B08B 13/00* (2013.01); *H01L 21/6708* (2013.01); *H01L 21/68714* (2013.01)

(58) Field of Classification Search
CPC ............. H01L 21/6719; H01L 21/6875; H01L 21/68714; H01L 21/6708; H01L 21/67103; B08B 3/04; B08B 13/00
See application file for complete search history.

(56) References Cited

U.S. PATENT DOCUMENTS 6,312,518 B1 * 11/2001 Kwon .................... G03F 7/168
118/69
7,513,265 B2 * 4/2009 Yoshikawa ....... H01L 21/67017
134/33
(Continued)

FOREIGN PATENT DOCUMENTS

JP 2010-073826 A 4/2010
JP 2013-120944 A 6/2013
(Continued)

OTHER PUBLICATIONS

Machine Translation of Korean Office Action in Application No. 10-2023-0178692, Sep. 2024. (Year: 2024).*
(Continued)

*Primary Examiner* — Benjamin L Osterhout
(74) *Attorney, Agent, or Firm* — Harness, Dickey & Pierce, P.L.C.

(57) ABSTRACT

The inventive concept provides a substrate treating apparatus. The substrate treating apparatus includes a housing for providing a treating space for treating a substrate within; a support unit for supporting the substrate in the treating space; a bottom supply port for supplying a process fluid to the treating space; and a filler member positioned below the substrate supported on the support unit in the treating space, and wherein the filler member forms a buffer space facing the bottom supply port, and a passage is formed between the filler member and an inner wall of the housing and flows the process fluid which is introduced to the buffer space in a direction of the substrate.

18 Claims, 13 Drawing Sheets

(51) Int. Cl.
   *B08B 13/00*   (2006.01)
   *H01L 21/67*   (2006.01)

(56) References Cited

U.S. PATENT DOCUMENTS

2015/0155188 A1*   6/2015   Jung ................. H01L 21/67051
                                                                34/558
2018/0190485 A1*   7/2018   Jang ................. H01L 21/67103
2018/0358242 A1*  12/2018   Kim .................. H01L 21/67126
2019/0164787 A1*   5/2019   Lee ................... H01L 21/6715

FOREIGN PATENT DOCUMENTS

| JP | 2014-175669 A | 9/2014 |
|---|---|---|
| KR | 10-2014-0112638 A | 9/2014 |
| KR | 10-2018-0077949 A | 7/2018 |
| KR | 10-2018-0079264 A | 7/2018 |
| KR | 102037844 B1 | 11/2019 |
| KR | 10-2020-0139852 A | 12/2020 |
| WO | WO-2013115156 A1 | 8/2013 |

OTHER PUBLICATIONS

Office Action for Korean Application No. 10-2023-0178692 dated Sep. 4, 2024.

* cited by examiner

APPARATUS FOR TREATING SUBSTRATE

CROSS-REFERENCE TO RELATED APPLICATIONS

A claim for priority under 35 U.S.C. § 119 is made to Korean Patent Application No. 10-2021-0142881 filed on Oct. 25, 2021, in the Korean Intellectual Property Office, the entire contents of which are hereby incorporated by reference.

BACKGROUND

Embodiments of the inventive concept described herein relate to a substrate treating apparatus, more specifically, a substrate treating apparatus performing a drying process on a substrate.

In general, various processes such as a photo process, an etching process, an ion implantation process, and a deposition process are performed to manufacture a semiconductor element. In addition, various foreign substances such as particles, organic contaminants, and metal impurities are generated while performing these processes. These foreign substances cause defects in the substrate and therefore act as a factor which directly affects a performance and a yield of the semiconductor element. A cleaning process for removing such foreign substances is essentially involved in a manufacturing process of the semiconductor element.

Recently, a supercritical fluid is used in a process of cleaning the substrate or a process of developing the substrate. According to an embodiment, a top surface of the substrate may be wetted with an anti-leaning liquid such as an isopropyl alcohol (IPA), and then a carbon dioxide ($CO_2$) may be supplied to the top surface of the substrate in a supercritical state to remove a remaining anti-leaning liquid.

An environment above a critical temperature and a critical pressure should be maintained inside a treating space in which a process using the supercritical fluid is performed. In addition, the supercritical fluid should be uniformly distributed within the treating space. However, due to structural problems inside the treating space, the supercritical fluid cannot flow uniformly inside the treating space. In an embodiment, if a supply port which supplies the supercritical fluid inside the treating space is disposed biased from a center of the treating space, the supercritical fluid is relatively concentrated in an area at which the supply port is provided. That is, the supercritical fluid flows asymmetrically inside the treating space. If the supercritical fluid is supplied into the treating space at a high speed, an asymmetry of the supercritical fluid inside the treating space is further enhanced. For this reason, a uniform processing cannot be performed on the substrate disposed on the treating space. In addition, due to the asymmetry of the supercritical fluid, a large amount of particles occur in a specific area of the substrate at which the supercritical fluid is supplied relatively more.

SUMMARY

Embodiments of the inventive concept provide a substrate treating apparatus for uniformly supplying a process fluid to a treating space.

Embodiments of the inventive concept provide a substrate treating apparatus for uniformly flowing a process fluid in a treating space, while the treating fluid is supplied to the treating space at a high speed.

Embodiments of the inventive concept provide a substrate treating apparatus for suppressing a concentration of particles at a specific region, while treating a substrate using a process fluid.

The technical objectives of the inventive concept are not limited to the above-mentioned ones, and the other unmentioned technical objects will become apparent to those skilled in the art from the following description.

The inventive concept provides a substrate treating apparatus. The substrate treating apparatus includes a housing for providing a treating space for treating a substrate within; a support unit for supporting the substrate in the treating space; a bottom supply port for supplying a process fluid to the treating space; and a filler member positioned below the substrate supported on the support unit in the treating space, and wherein the filler member forms a buffer space facing the bottom supply port, and a passage is formed between the filler member and an inner wall of the housing and flows the process fluid which is introduced to the buffer space in a direction of the substrate.

In an embodiment, the bottom supply port is positioned to overlap the buffer space when seen from above.

In an embodiment, the housing includes a top housing and a bottom housing, and the top housing forms a groove having an open top, and at least a portion of the filler member is inserted into the groove.

In an embodiment, the filler member includes: a base portion; and a protrusion portion extending from a bottom surface of the base portion in a downward direction.

In an embodiment, the base portion is provided spaced apart from the inner wall of the housing.

In an embodiment, at least one support pin is formed at a top surface of the base portion to space apart the substrate from the support unit in a predetermined distance by contacting a bottom surface of the substrate placed on the support unit.

In an embodiment, a slit in a spiral shape is formed along an inner surface along the inner surface of the protrusion portion which defines the buffer space.

In an embodiment, the filler member includes: a base portion; and a protrusion portion extending from a bottom surface of the base portion in a downward direction, and wherein at least a portion of the protrusion portion is inserted in the groove, and the base portion is positioned above the groove and provided larger than an area of the groove when seen from above.

In an embodiment, a plurality of support protrusions spaced apart from each other are formed at a bottom end of the protrusion portion, a support protrusion spaces apart the bottom end of the protrusion portion from a bottom surface which defines the groove, and a top end of the protrusion portion is positioned higher than a top end of the groove, and a space between the support protrusions is provided as the passage.

In an embodiment, the process fluid is a supercritical fluid.

The inventive concept provides a substrate treating apparatus. The substrate treating apparatus includes a housing for providing a treating space for treating a substrate within; a support unit for supporting the substrate in the treating space; a supply port for supplying a process fluid to the treating space; and a buffer plate forming a buffer space by coupling together with a groove formed at the housing and having an opening for communicating the treating space and the buffer space.

In an embodiment, the substrate treating apparatus further includes a filler member positioned below the substrate supported on the support unit in the treating space, the filler member positioned below the buffer plate.

In an embodiment, the housing includes a first housing and a second housing, and the second housing has the groove formed indented in a direction away from the substrate supported on the support unit.

In an embodiment, the buffer plate is positioned at the groove, and a region of the buffer plate facing the process fluid supplied from the supply port is a blocking region.

In an embodiment, the filler member is provided having an area larger than the groove when seen from above.

In an embodiment, a bottom surface of the filler member is provided higher than a top surface of the buffer plate.

In an embodiment, the process fluid is a supercritical fluid.

The inventive concept provides a substrate treating apparatus. The substrate treating apparatus includes a housing proving a treating space for treating a substrate therein, and including a top housing and a bottom housing having a groove with an open top; a support unit for supporting the substrate at the treating space; a top supply port for supplying a process fluid from above the treating space; a bottom supply port for supplying the process fluid from below or side the treating space; and a filler member positioned below the substrate supported on the support unit in the treating space, and wherein the filler member has a buffer space formed facing the bottom supply port, and a passage is formed between the filler member and an inner wall of the housing and flows the process fluid which is introduced to the buffer space by the bottom supply port in a direction of the substrate.

In an embodiment, the filler member includes: a base portion; and a protrusion portion in a ring shape extending from a bottom surface of the base portion in a downward direction, and wherein the base portion is positioned above the groove and is larger than an area of the groove when seen from above, and wherein the protrusion portion is positioned within the groove, and spaced apart from a side surface of the groove toward a center of the groove.

In an embodiment, a support protrusion is formed at a bottom end of the protrusion portion, the bottom end of the protrusion portion is spaced apart from a bottom surface of the groove in an upward direction, and a top end of the protrusion portion is positioned higher than a top end of the groove.

According to an embodiment of the inventive concept, a substrate may be effectively treated.

According to an embodiment of the inventive concept, a process fluid may be uniformly supplied to a treating space.

According to an embodiment of the inventive concept, a treating fluid may uniformly flow in a treating space, while a process fluid is supplied to the treating space at a high speed.

According to an embodiment of the inventive concept, a concentration of particles at a specific region of a substrate may be suppressed, while the substrate is treated by using a process fluid.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
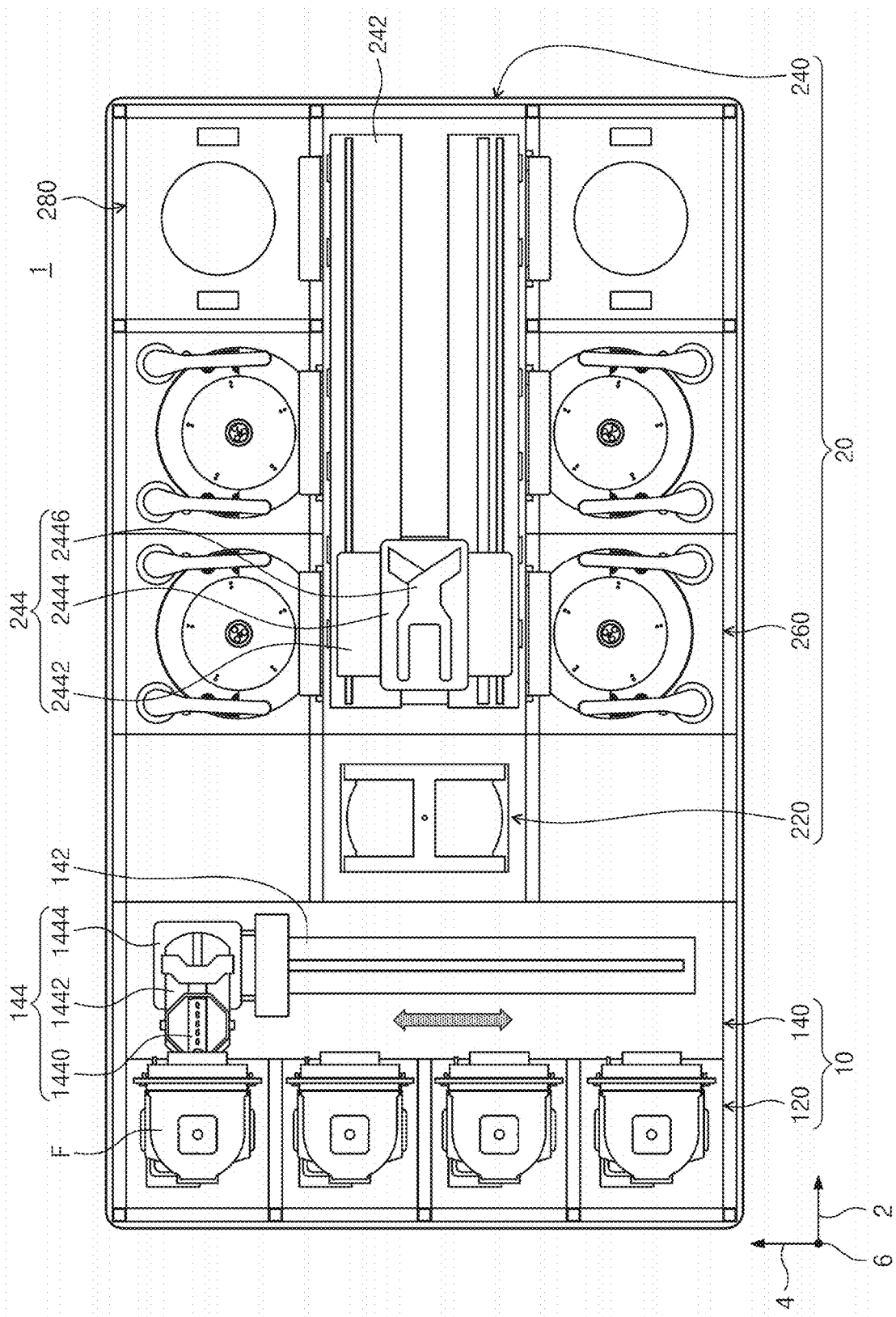
FIG. 1 schematically illustrates a substrate treating apparatus according to an embodiment of the inventive concept.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. The embodiment is provided to more fully explain the inventive concept to a person with average knowledge in the art. Therefore, the form of the components in the drawings is exaggerated to emphasize a clearer description.

It should be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

Spatially relative terms (e.g., "beneath," "below," "lower," "above," "upper," and the like) may be used herein for ease of description to describe one element or feature's relationship to another element(s) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

In the embodiment, a process of liquid treating a substrate by supplying a liquid such as a cleaning liquid onto the substrate will be described as an example. However, the embodiment is not limited to a cleaning process, and may be applied to various processes for treating the substrate using a treating liquid such as an etching process, an ashing process, a developing process, and the like.

Hereinafter, an embodiment of a substrate treating apparatus 1 of the inventive concept will be described in detail with reference to FIG. 1 to FIG. 10. The substrate treating apparatus 1 according to an embodiment of the inventive concept may perform a cleaning process including a supercritical drying process.

FIG. 1 schematically illustrates a substrate treating apparatus according to an embodiment of the inventive concept. Referring to FIG. 1, the substrate treating apparatus 1 includes an index module 10 and a treating module 20. According to an embodiment, the index module 10 and the treating module 20 are disposed in a direction. Hereinafter, a direction in which the index module 10 and the treating module 20 are disposed is referred to as a first direction 2, a direction perpendicular to the first direction 2 when seen from above is referred to as a second direction 4, and a direction perpendicular to a plane including both the first direction 2 and the second direction 4 is defined as a third direction 6.

The index module 10 transfers the substrate W from a container F in which the substrate W is stored to the treating module 20 that treats the substrate W. The index module 10 receives the substrate W that has been treated at the treating module 20 and stores the substrate W at the container F. A lengthwise direction of the index module 10 is provided in the second direction 4. The index module 10 has a load port 120 and an index frame 140.

The container F in which the substrate W is stored is mounted on the load port 120. The load port 110 and the treating module 300 are disposed on two opposite sides of the index frame 140. The load port 120 may be provided in a plurality, and the plurality of load ports 120 may be arranged in a direction along the second direction 4. The number of load ports 120 may increase or decrease according to a process efficiency and a foot print condition of the treating module 20.

A plurality of slots (not shown) are formed at the container F to store the substrates W in a state in which the substrates W are horizontally arranged with respect to the ground. As the container F, a sealed container such as a front opening unified pod (FOUP) may be used. The container F may be placed on the load port 120 by a transfer means (not shown) such as an overhead transfer, an overhead conveyor, or an automatic guided vehicle, or by an operator.

An index rail 142 and an index robot 144 are provided within the index frame 140. The index rail 142 is provided with its lengthwise direction along the second direction 4 within the index frame 140. The index robot 144 may transfer the substrate W. The index robot 144 may transfer the substrate W between the index module 10 and the buffer unit 220. The index robot 144 may include an index hand 1440.

The substrate W may be placed on the index hand 1440. The index hand 1440 may include an index base 1442 having an annular ring form in which a part of the circumference is symmetrically cut-out, and an index support unit 1444 for moving the index base 1442. A configuration of the index hand 1440 is the same as or similar to a configuration of a transfer hand to be described later. The index hand 1440 may be provided to be movable along the second direction 4 along the index rail 142. Accordingly, the index hand 1440 may forwardly and backwardly move along the index rail 142. In addition, the index hand 1440 may be provided to be rotatable with the third direction 6 as an axis, and movable along the third direction 6.

The treating module 20 includes a buffer unit 220, a transfer chamber 240, a liquid treating chamber 260, and a drying chamber 280. The buffer unit 220 provides a space in which a substrate W taken into the treating module 20 and a substrate W taken out from the treating module 20 temporarily remain. The transfer chamber 240 provides a space for transferring the substrate W between the buffer unit 220, the liquid treating chamber 260, and the drying chamber 280.

The liquid treating chamber 260 may perform a liquid treating process of treating the substrate W by supplying a liquid onto the substrate W. For example, the liquid treating process may be a cleaning process of cleaning the substrate with a cleaning liquid. A chemical treatment, a rinsing treatment, and a drying treatment may all be performed on the substrate within the process chamber. The drying chamber 280 performs a drying process for removing a liquid remaining on the substrate.

The buffer unit 220 may be disposed between the index frame 140 and the transfer chamber 240. The buffer unit 220 may be disposed at an end of the transfer chamber 240. A slot (not shown) on which the substrate W is placed is provided inside the buffer unit 220. A plurality of slots (not shown) are provided to be spaced apart from each other along the third direction 6. A front face and a rear face of the buffer unit 220 are opened. The front face is a surface facing the index module 10, and the rear face is a surface facing the transfer chamber 240. The index robot 144 may access the buffer unit 220 through the front face, and the transfer robot 244, which will be described later, may access the buffer unit 220 through the rear face.

A lengthwise direction of the transfer chamber 240 may be provided in the first direction 2. The liquid treating chamber 260 and the drying chamber 240 may be disposed on both sides of the transfer chamber 240. The liquid treating chamber 260 and the transfer chamber 240 may be disposed in the second direction 4. The drying chamber 280 and the transfer chamber 240 may be disposed along the second direction 4.

According to an embodiment, the liquid treating chambers 260 may be disposed on both sides of the transfer chamber 240, the drying chambers 280 may be disposed on both sides of the transfer chamber 240, and the liquid treating chambers 260 may be provided closer to the buffer unit 220 than the drying chambers 280. At a side of the transfer chamber 240, the liquid treating chambers 260 may be provided in an arrangement of A×B (A and B are natural numbers greater than 1 or 1) along the first direction 2 and the third direction 6, respectively. Also, at a side of the transfer chamber 240, the drying chambers 280 may be provided in an arrangement of C×D (C and D are natural numbers greater than 1 or 1) along the first direction 2 and the third direction 6, respectively. Unlike the above, the liquid treating chambers 260 may be provided only at a side of the transfer chamber 240, and the drying chambers 280 may be provided only at the other side of the transfer chamber 240.

The transfer chamber 240 includes a guide rail 242 and a transfer robot 244. The guide rail 242 is provided with its lengthwise direction in the first direction 2 within the transfer chamber 240. The transfer robot 244 may be provided to be linearly movable along the first direction 2 on the guide rail 242. The transfer robot 244 transfers the substrate W between the buffer unit 220, the liquid treating chamber 260, and the drying chamber 280.

The transfer robot 2440 includes a base 2442, a body 2444, and an arm 2446. The base 2442 is installed to be movable in the first direction 2 along the guide rail 242. The body 2444 is coupled to the base 2442. The body 2444 is provided to be movable along the third direction 6 on the base 2442. In addition, the body 2444 is provided to be rotatable on the base 2442. The arm 2446 is coupled to the body 2444, which is provided to be forwardly and backwardly movable with respect to the body 2444. The arm 2446 is provided in a plurality to be driven individually, respectively. The arms 2446 are disposed to be stacked on each other and spaced apart from each other along the third direction 6.

The liquid treating chamber 260 performs a liquid treating process on the substrate W. For example, the liquid treating chamber 260 may be a chamber that performs a cleaning process by supplying the cleaning liquid to the substrate W. Unlike this, the liquid treating chamber 260 may be a chamber that performs a wet etching process of removing a thin film on the substrate by supplying a liquid plasma.

The liquid treating chamber 260 may have a different structure depending on a type of a process for treating the substrate W. Alternatively, each of the liquid treating chambers 260 may have a same structure. Selectively, the liquid treating chambers 260 may be divided into a plurality of groups, and the liquid treating chambers 260 belonging to one of the groups may be liquid treating chambers 260 performing any one of the cleaning process and the wet etching process, and liquid treating chambers 260 belong to another one of the groups may be liquid treating chambers 260 performing any one of the cleaning process and the wet etching process.

In the following embodiment of the inventive concept, a case where the liquid treating process of treating the substrate W by supplying a liquid onto the substrate W from the liquid treating chamber 260 will be described as an example.

Figure 2:
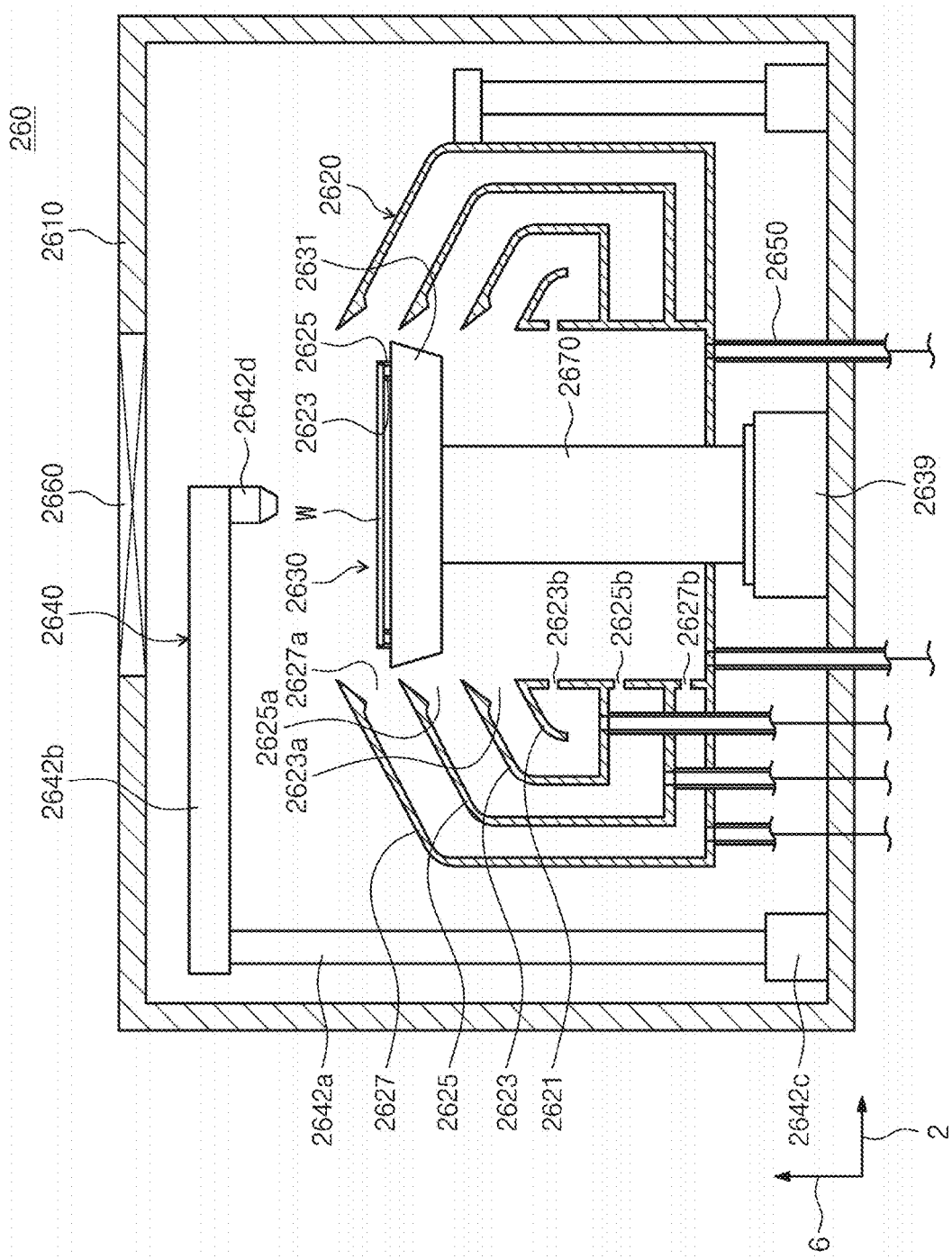
FIG. 2 schematically illustrates an embodiment of a liquid treating chamber of the substrate treatment apparatus of FIG. 1.

FIG. 2 schematically illustrates an embodiment of the liquid treating chamber 260 of FIG. 1. Referring to FIG. 2, the liquid treating chamber 260 includes a housing 2610, a treating container 2620, a support unit 2630, lifting/lowering unit 2640, a liquid supply unit 2650, an exhaust unit 2660, and an airflow supply unit 2680.

The housing 2610 has a space therein. The housing 2610 has generally a rectangular parallelepiped form. The treating container 2620, the support unit 2630, and the liquid supply unit 2640 are disposed within the housing 2610.

The treating container 2620 has a treating space with an open top. The substrate W is liquid-treated within the treating space. The support unit 2630 supports the substrate W in the treating space and rotates the substrate W. The liquid supply unit 2640 supplies a liquid onto the substrate W supported by the support unit 2630. The liquid may be provided in a plurality of types and may be sequentially supplied onto the substrate W.

According to an embodiment, the treating container 2620 has a guide wall 2621 and a plurality of recollecting containers 2623, 2625, and 2627. Each of the recollecting containers 2623, 2625, and 2627 separates and recollects different liquids from the liquids used for the substrate treatment. Each of the recollecting containers 2623, 2625, and 2627 has a recollecting space for recollecting the liquid used for the substrate treatment. The guide wall 2621 and each of the recollecting containers 2623, 2625, and 2627 are provided in an annular ring form surrounding the support unit 2630. When the liquid treating process is performed, a liquid scattered by the rotation of the substrate W is introduced into the recollecting space through inlets 2623a, 2625a, and 2627a to be described later of the recollecting containers 2623, 2625, and 2627 respectively. Different types of the treating liquid may flow into each recollecting container.

According to an embodiment, the treating container 2620 has the guide wall 2621, the first recollecting container 2623, the second recollecting container 2625 and the third recollecting container 2627. The guide wall 2621 is provided in an annular ring form surrounding the support unit 2630, and the first recollecting container 2623 is provided in an annular ring form surrounding the guide wall 2621. The second recollecting container 2625 is provided in an annular ring form surrounding the first recollecting container 2623, and the third recollecting container 2627 is provided in an annular ring form surrounding the second recollecting container 2625. A space between the first recollecting container 2623 and the guide wall 2621 functions as a first inlet 2623a through which a liquid is introduced. A space between the first recollecting container 2623 and the second recollecting container 2625 functions as a second inlet 2625a through which a liquid is introduced. A space between the second recollecting container 2625 and the third recollecting container 2627 functions as a third inlet 2627a through which a liquid is introduced. The second inlet 2625a is positioned above the first inlet 2623a, and the third inlet 2627a can be positioned above the second inlet 2625a.

A space between a bottom end of the guide wall 2621 and the first recollecting container 2623 functions as a first outlet 2623b through which a fume and an airflow generated from the liquid are discharged. A space between a bottom end of the first recollecting container 2623 and the second recollecting container 2625 functions as a second outlet 2625b through which the fume and the airflow generated from the liquid are discharged. A space between a bottom end of the second recollecting container 2625 and the third recollecting container 2627 functions as a third outlet 2627b through which the fume and the airflow generated from the liquid are discharged. The fume and the airflow discharged from the first outlet 2623b, the second outlet 2625b, and the third outlet 2627b are exhausted through an exhaust unit 2650 to be described later.

The recollecting lines(not shown) extending vertically in a bottom direction of a bottom surface are connected to each recollecting container 2623, 2625, 2627.

The support unit 2630 has a spin chuck 2631, a support pin 2633, a chuck pin 2635, a rotation shaft 2637, and a driving part 2639. The spin chuck 2631 has a top surface, which is generally a circular form when viewed from above. The top surface of the spin chuck 2631 may have a diameter larger than that of the substrate W.

The support pin 2633 may be provided in a plurality. The support pins 2633 are disposed at an edge portion of the top surface of the spin chuck 2631 to be spaced apart from each other at a predetermined interval with defining an annular ring, and upwardly protrude from the spin chuck 2631. The support pins 2633 support an edge of rear surface of the substrate W such that the substrate W is spaced apart from the top surface of the spin chuck 2631 by a predetermined distance.

The chuck pin 2635 may be provided in a plurality. The chuck pins 2635 are disposed to be farther from a center of the spin chuck 2631 than the support pin 2633. The chuck pins 2635 protrude from the top surface of the spin chuck 2631. The chuck pins 2635 support a side portion of the substrate W so that the substrate W does not laterally shift or sway when the substrate W is rotated. The chuck pins 2635 are movable between a standby position and a support position along a radial direction of the spin chuck 2631. The standby position is a position far from the center of the spin chuck 2631 compared to the support position. When the substrate W is loaded or unloaded on the support unit 2630, the chuck pin 2635 is positioned at the standby position, and when a process is performed on the substrate W, the chuck pin 2635 is positioned at the support position to support the substrate W and to block lateral shifting or swaying of the substrate W. At the support position, the chuck pins 2635 are in contact with the side of the substrate W.

The rotation shaft 2637 is coupled to the spin chuck 2631. The rotation shaft 2637 may be coupled to a bottom surface of the spin chuck 2631. The rotation shaft 2637 is provided to be rotatable by receiving a power from the driving part 2639. The driving part 2639 rotates the rotation shaft 2637, thereby rotating the spin chuck 2631. The driving part 2639 may vary a rotation speed of the rotation shaft 2637. The driving part 2639 may be a motor that provides a driving force. However, the inventive concept is not limited thereto, and the driving part 2639 may be variously modified as a known device that provides a driving force.

The liquid supply unit 2640 supplies a liquid onto the substrate W supported by the support unit 2630. The liquid supply unit 2640 is provided in a plurality, and each supplies a different type of liquid. According to an embodiment, the liquid supply unit 2640 includes a first liquid supply member 2642 and a second liquid supply member(not shown).

The first liquid supply member 2642 includes a support shaft 2642a, a support arm 2642b, an arm driver 2642c, and a nozzle 2642d. The support shaft 2642a is disposed near the sidewall of the treating container 2620. The support shaft 2642a has a rod shape extending vertically. The support shaft 2642a is provided to be rotatable by the arm driver 2642c. The support arm 2642b is coupled to a top end of the support shaft 2642a. The support arm 2642b extends horizontally from the support shaft 2642a. The nozzle 2642d is fixedly coupled to an end of the support arm 2642b. As the support shaft 2642a is rotated, the nozzle 2642d may swing together with the support arm 2642b. The nozzle 2642d may be swing-moved to a process position and a standby position. Here, the process position is a position where the nozzle 2642d faces the substrate W supported by the support unit 2630, and the standby position is a position where the nozzle 2642d is out of the process position.

In some embodiments, the support arm 2642b may be provided to be forwardly and backwardly movable in its lengthwise direction. When viewed from above, the nozzle 2642d may be swing-moved to coincide with a central axis of the substrate W.

The second liquid supply member(not shown) supplies a second liquid onto the substrate W supported by the support unit 2630. The second liquid supply member is provided to have the same configuration as the first liquid supply member 2642. Accordingly, a detailed description of the second liquid supply member will be omitted.

The first treating liquid and the second treating liquid may be any one of a chemical, a rinsing liquid, or an organic solvent. For example, the chemical may include a diluted sulfuric acid peroxide ($H_2SO_4$), a phosphoric acid ($P_2O_5$), a hydrofluoric acid (HF), and an ammonium hydroxide ($NH_4OH$). For example, the rinsing solution may include a water or a deionized water (DIW). For example, the organic solvent may include an alcohol such as an isopropyl alcohol (IPA).

The exhaust unit 2650 exhausts the fume and the gas generated in the treating space. The exhaust unit 2650 exhausts the fume and the gas generated when the substrate W is liquid-treated. The exhaust unit 2650 may be coupled to a bottom surface of the treating container 2620. In an embodiment, the exhaust unit 2650 may be positioned between the rotation shaft 2637 of the support unit 2630 and an inner wall of the treating container 2620. A depressurizing unit (not shown) is provided at the exhaust unit 2650. The fume and the gas generated during a liquid treatment of the substrate W by the depressurizing unit are exhausted from the treating space to an outside of the treating space.

The airflow supply unit 2660 supplies an airflow to the inner space of the housing 2610. The airflow supply unit 2660 may supply a downward airflow to the inner space. The airflow supply unit 2660 may be installed at the housing 2610. The airflow supply unit 2660 may be installed above the treating container 2620 and the support unit 2630. A gas supplied to the inner space of the housing 2610 through the airflow supply unit 2660 forms a downward airflow in the inner space. The gas by-products generated by the treating process within the treating space are discharged to an outside of the housing 2610 through the exhaust unit 2650 by the downward airflow. The airflow supply unit 2660 may be provided as a fan filter unit.

The substrate treating apparatus 1 may perform a supercritical process of treating the substrate W using a supercritical fluid as a process fluid. The supercritical process is performed using the properties of the supercritical fluid. As a representative example, there is a supercritical drying process and a supercritical etching process. Hereinafter, the supercritical process will be described based on the supercritical drying process. However, since this is only for ease of description, the substrate treating apparatus 1 may perform another supercritical process other than the supercritical drying process.

The supercritical drying process is performed by dissolving an organic solvent remaining on a circuit pattern of the substrate W with the supercritical fluid to dry the substrate W. The supercritical drying process not only has an excellent drying efficiency, but can also prevent a pattern leaning phenomenon. A material having a miscibility with the organic solvent may be used as the supercritical fluid used in the supercritical drying process. For example, a supercritical carbon dioxide ($scCO_2$) may be used as the supercritical fluid.

Figure 3:
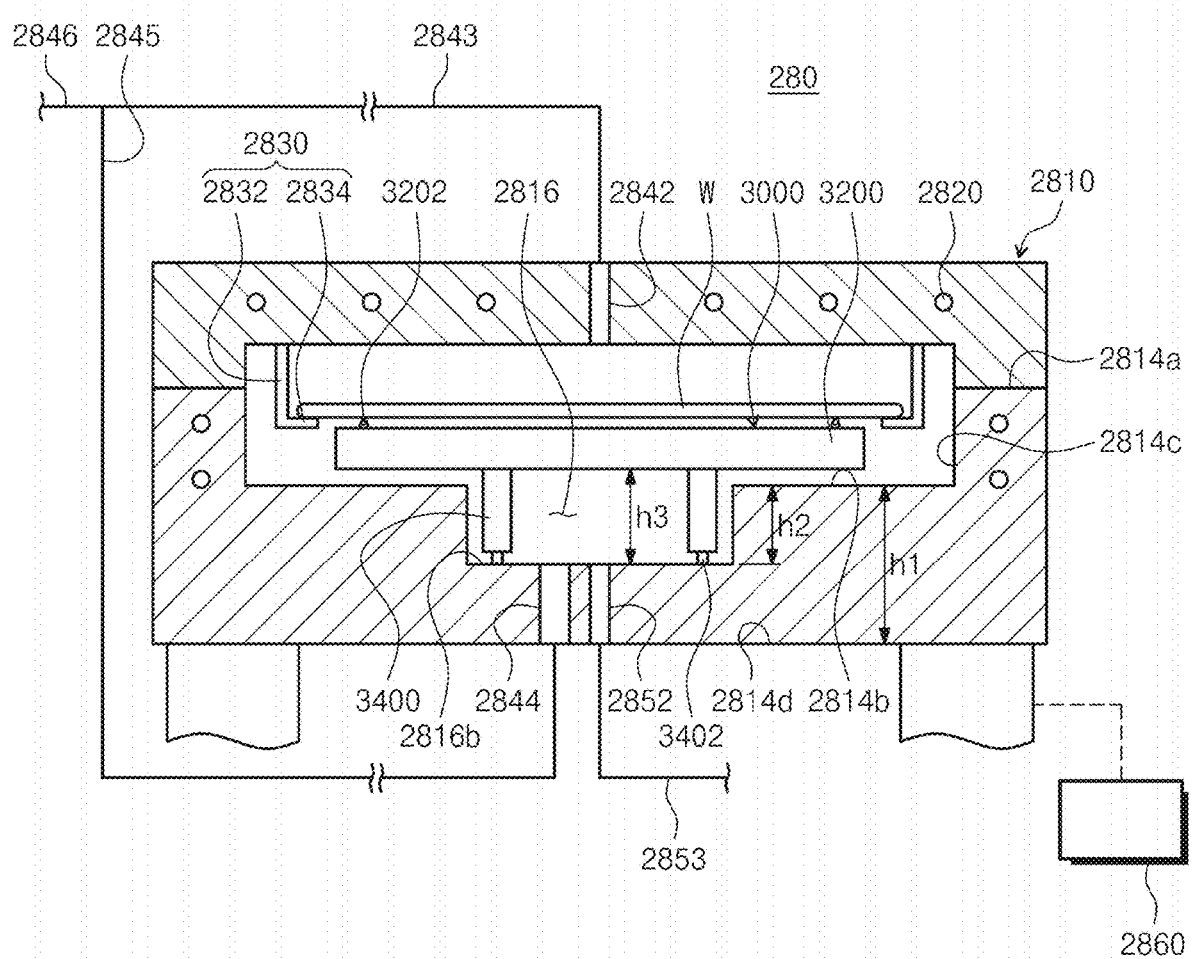
FIG. 3 schematically illustrates an embodiment of a drying chamber of the substrate treating apparatus of FIG. 1.

FIG. 3 schematically illustrates an embodiment of the drying chamber of FIG. 1. Referring to FIG. 3, in the drying chamber 280 in accordance with an embodiment of the inventive concept, the treating liquid remaining on the substrate W may be removed using the process fluid. A carbon dioxide ($CO_2$) gas in a supercritical state may be used as the process fluid. The carbon dioxide may change into the supercritical state by increasing a temperature to 30° C. or above and maintaining a pressure at 7.4 MPa or more.

Hereinafter, the process fluid will be described as an example of the carbon dioxide gas. In addition, the process fluid may be converted into the supercritical state before being introduced into the treating space of the drying chamber 280, or may be converted into the supercritical state after being introduced into the treating space of the drying chamber 280.

The drying chamber 280 may include a housing 2810, a heating unit 2820, a support unit 2830, a fluid supply unit 2840, a fluid discharge unit 2850, and a filler member 3000.

The housing 2810 provides a treating space in which a supercritical process is performed. The housing 2810 may provide the treating space in which the substrate W is treated. The housing 2810 is made of a material capable of enduring a critical temperature and a pressure at or above a critical pressure of the supercritical fluid. The housing 2810 may include a top housing 2812 (an exemplary first housing) and a bottom housing 2814 (an exemplary second housing). In an embodiment, the top housing 2812 and the bottom housing 2814 may be combined with each other to provide the treating space therein. In contrast, the housing 2810 may be formed integrally without being divided into top and bottom parts, and an opening (not shown) which functions as an entrance through which the substrate W can enter and exit may be formed on a side wall. Hereinafter, a case in which the top housing 2812 and the bottom housing 2814 are combined with each other to provide the treating space therein will be described as an example.

The top housing 2812 may have a cylindrical shape with an open bottom. The top housing 2812 may have a space in which a bottom surface is opened. A top wall of the top housing 2812 may be provided as a top wall of the housing 2810. In addition, a sidewall of the top housing 2812 may be provided as a portion of the sidewall of the housing 2810.

The bottom housing 2814 is disposed below the top housing 2812. The bottom housing 2814 may have a cylindrical shape with an open top. The bottom housing 2814 may have a space with an open top surface therein. An open top surface of the bottom housing 2814 may face an open bottom surface of the top housing 2812. A bottom wall of the bottom housing 2814 may be provided as a bottom wall of the housing 2810. A sidewall of the bottom housing 2814 may be provided as a portion of the sidewall of the housing 2810.

The bottom housing 2814 may be provided in a stepped shape. In an embodiment, the bottom housing 2814 may have a top surface 2814a, a bottom surface 2814b, a side surface 2814c, and a groove 2816. The top surface 2814a may be in contact with the sidewall of the top housing 2812. The bottom surface 2814b may be provided below the top surface 2814a. The side surface 2814c connects the top surface 2814a and the bottom surface 2814b. In an embodiment, the side surface 2814c may vertically extend from the top surface 2814a to the bottom surface 2814b in a downward direction. In contrast, the side surface 2814c may be formed to be downwardly inclined so that a height of the side surface 2814c becomes gradually decreases from the top surface 2814a to the bottom surface 2814b. The top surface 2814a, the bottom surface 2814b, the side surface 2814c, and the top housing 2812 may be combined with each other to provide the treating space therein.

The groove 2816 may be formed in the bottom surface 2814b. The groove 2816 may be formed to a predetermined depth. The groove 2816 may be formed by being indented in a direction away from the substrate W supported by the support unit 2830 from the bottom surface 2814b of the bottom housing 2814 (i.e., in a direction from a top to a bottom). For example, the groove 2816 may be formed at a second height h2, which is lower than a first height h1 from the bottom surface 2814b to the bottom surface 2814d of the bottom housing 2814. The groove 2816 may be formed in a substantially cylindrical shape.

The top housing 2812 and the bottom housing 2814 may open or seal the treating space by a relative movement between each other. One of the top housing 2812 or the bottom housing 2814 may be coupled to the driver 2860 to be moved in the up/down direction. For example, the bottom housing 2814 may be coupled to the driver 2860 to be moved in the up/down direction by the driver 2860. Accordingly, the treating space of the housing 2810 may be selectively sealed. In an embodiment, if the bottom housing 2814 is spaced apart from the top housing 2812, the treating space is opened. In this case, the substrate W may be taken in or taken out. During the process, the bottom housing 2814 may be in close contact with the top housing 2812 to seal the treating space from the outside.

The aforementioned example illustrates that the bottom housing 2814 combines with the driver 2860 to move in the up/down direction, but the inventive concept is not limited to it. For example, the top housing 2812 may be coupled to the driver 2860 to be moved in the up/down direction. Hereinafter, for convenience of description, a case in which the bottom housing 2814 is coupled to the driver 2860 and moved in the up/down direction will be described as an example.

The heating unit 2820 may heat the process fluid supplied to the treating space. The heating unit 2820 may increase a temperature inside the treating space. In an embodiment, the heating unit 2820 may be provided as a heater. However, the inventive concept is not limited thereto, and the heating unit 2820 may be variously transformed into a known device capable of increasing the temperature of the treating space. As the heating unit 2820 increases the temperature of the treating space, the process fluid supplied to the treating space may be converted into a supercritical state or may be maintained in the supercritical state.

The heating unit 2820 may be buried in the housing 2810. For example, the heating unit 2820 may be disposed inside a wall of the housing 2810. For example, the heating unit 2820 may be provided in at least one of the top housing 2812 or the bottom housing 2814. The heating unit 2820 may be provided at various positions capable of increasing the temperature of the treating space.

The support unit 2830 supports the substrate W in the treating space of the housing 2810. The support unit 2830 may be configured to support an edge region of the substrate W in the treating space. For example, the support unit 2830 may be configured to support a bottom surface of an edge region of the substrate W in the treating space.

The support unit 2830 may include a fixing rod 2832 and a holder 2834. The fixing rod 2832 may downwardly protrude from the bottom surface of the top housing 2812. The fixing rod 2832 may be fixedly installed to the top housing 2812. The fixing rod 2832 may be provided with its lengthwise direction in the up/down direction. A plurality of fixing rods 2832 are provided, and may be positioned to be spaced apart from each other. If the substrate W is taken in or taken out of a space surrounded by the fixing rods 2832, the fixing rods 2832 are disposed at positions which do not interfere with the substrate W.

A holder 2834 may be coupled to a bottom end of each of the fixing rods 2832. The holder 2834 may extend from a bottom end of the fixing rod 2832 in a direction horizontal to the ground. In an embodiment, the holder 2834 may extend in a shape capable of supporting a bottom edge of the substrate W.

The fluid supply unit 2840 supplies a process fluid to the treating space. The process fluid may include a carbon dioxide ($CO_2$). The process fluid may be supplied to the treating space in a supercritical state. Alternatively, the process fluid may be supplied to the treating space in a gas state and may be converted to the supercritical state in the treating space. The fluid supply unit 2840 may include a top supply port 2842 and a bottom supply port 2844.

The top supply port 2842 may supply the process fluid to the treating space. The top supply port 2842 may be provided at a central area of the top wall of the housing 2810. The top supply port 2842 may supply the process fluid to a space corresponding to a top portion of the substrate W. The process fluid supplied from the top supply port 2842 may be supplied to a top surface of the substrate W.

The bottom supply port 2844 may supply the process fluid to the treating space. The bottom supply port 2844 may supply the process fluid to a buffer space to be described later. The bottom supply port 2844 may be provided on the bottom surface of the housing 2810. In an embodiment, the bottom supply port 2844 may be provided on the bottom surface 2814d of the bottom housing 2814. In an embodiment, the bottom supply port 2844 may be provided at a position biased by a predetermined distance from a center of the bottom surface 2814d. The bottom supply port 2844 may be positioned to overlap the buffer space to be described later when viewed from above. In one embodiment, a center of the bottom surface 2814d may be a position corresponding to a center of the substrate W supported by the support unit 2830. A discharge port of the bottom supply port 2844 may be provided in the groove 2816. In an embodiment, the discharge port of the bottom supply port 2844 may be formed on the bottom surface 2816b of the groove 2816. The discharge port of the bottom supply port 2844 may be provided at a position biased by a predetermined distance from the center of the bottom surface 2816b of the groove 2816. The bottom supply port 2844 may penetrate the bottom body 2814 in the up/down direction from the bottom surface 2816b of the groove 2816 to the bottom surface 2814d of the bottom housing 2814.

The top supply port 2842 may be connected to a top branch line 2843. The top branch line 2843 may be branched from an end of a main line 2846. The other end of the main line 2846 may be connected to a fluid supply source (not shown). The fluid supply source (not shown) may store and/or supply the process fluid. The fluid supply source (not shown) may be a reservoir. The bottom supply port 2844 may be connected to a bottom branch line 2845. The bottom branch line 2845 may be branched from an end of the main line 2846.

The fluid discharge unit 2850 discharges the process fluid from the treating space. The fluid discharge unit 2850 may discharge the process fluid supplied to the treating space to the outside of the housing 2810. The fluid discharge unit 2850 may include an exhaust port 2852.

The exhaust port 2852 may be provided on the bottom surface of the housing 2810. In an embodiment, the exhaust port 2852 may be provided on the bottom surface 2814d of the bottom housing 2814. The exhaust port 2852 may be disposed adjacent to the bottom supply port 2844. In an embodiment, the exhaust port 2852 may be provided at the center of the bottom surface 2814d. The discharge port of the exhaust port 2852 may be provided in the groove 2816. In an embodiment, the discharge port of the exhaust port 2852 may be formed on the bottom surface 2816b of the groove 2816. The discharge port of the exhaust port 2852 may be formed at the center of the bottom surface 2816b of the groove 2816. The exhaust port 2852 may penetrate the bottom body 2814 in the up/down direction from the bottom surface 2816b of the groove 2816 to the bottom surface 2814b of the bottom housing 2814.

A diameter of the exhaust port 2852 may be provided smaller than a diameter of the bottom supply port 2844. The process fluid exhausted from the exhaust port 2852 may include a supercritical fluid in which the organic solvent is dissolved. The process fluid exhausted from the exhaust port 2852 may be transferred to a regeneration device (not shown). The regeneration device (not shown) may separate the process fluid into a supercritical fluid and an organic solvent. Alternatively, the process fluid exhausted from the exhaust port 2852 may be discharged to the atmosphere through the exhaust line 2853.

Figure 4:
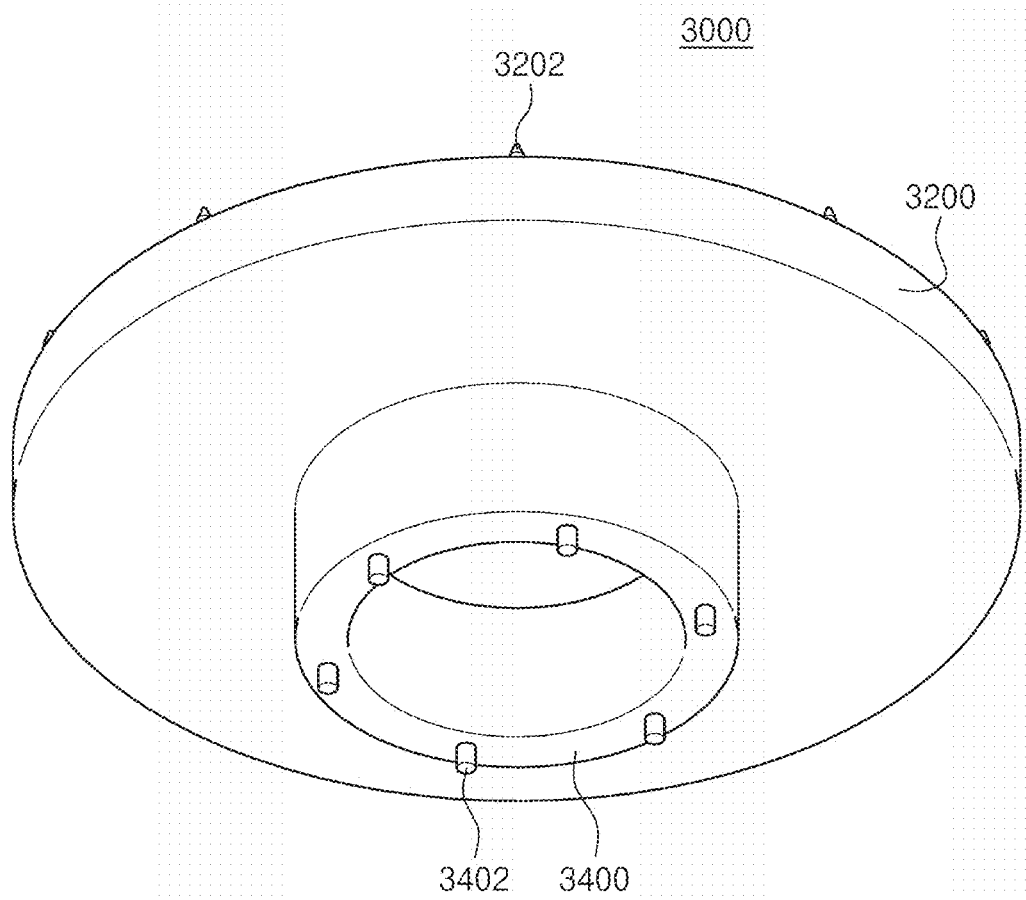
FIG. 4 is a perspective view schematically illustrating an embodiment of a filler member of FIG. 3.

FIG. 4 is a perspective view schematically illustrating an embodiment of the filler member of FIG. 3. Referring to FIG. 3 and FIG. 4, the filler member 3000 is positioned inside the treating space. The filler member 3000 may be positioned below the support unit 2830. In an embodiment, the filler member 300 may be disposed below the substrate W supported by the support unit 2830 in the treating space of the housing 2810.

A buffer space facing the bottom supply port 2844 may be formed in the filler member 3000. For example, a bottom portion of the filler member 3000 may be indented from a bottom to a top direction to form the buffer space. A base portion 3200 and a protrusion portion 3400 of the filler member 3000 to be described later may be combined with each other to provide the buffer space. For example, the buffer space may be defined by being surrounded by the base portion 3200, the protrusion portion 3400, and the bottom surface 2816b of the groove 2816. In addition, the bottom supply port 2844 may be positioned to overlap the buffer space when viewed from above. In addition, the bottom supply port 2844 described above may be positioned to overlap the buffer space. The bottom supply port 2844 may be disposed below the buffer space. In an embodiment, the bottom supply port 2844 may be positioned between an inner surface of the protrusion portion 3400.

The filler member 3000 may include the base portion 3200 and the protrusion portion 3400. In an embodiment, the base portion 3200 and the protrusion portion 3400 may be integrally formed.

The base portion 3200 may be positioned on a top portion of the groove 2816. The base portion 3200 may be provided larger than an area of the groove 2816 when viewed from above. The base portion 3200 may be provided in a disk shape having a predetermined thickness. The base portion 3200 has a top surface, a bottom surface, and a side surface. The top surface is positioned to face the bottom surface of the substrate W supported by the support unit 2830. A support pin 3202 may be formed on a top surface of the base portion 3200. The support pin 3202 may be in contact with the bottom surface of the substrate W supported by the holder 2834 to separate the substrate W by a predetermined distance in the upward direction. However, the inventive concept is not limited thereto, and the support pin 3202 may not be in contact with the substrate W. The substrate W and the top surface of the base portion 3200 may be spaced apart from each other by a predetermined distance by the support pin 3202.

The protrusion portion 3400 may be positioned on a bottom surface of the base portion 3200. The protrusion portion 3400 may downwardly extend from the bottom surface of the base portion 3200. At least a portion of the protrusion portion 3400 may be inserted into the groove 2816. At least a portion of the protrusion portion 3400 may be provided inside the groove 2816. A top end of the protrusion portion 3400 may be positioned higher than a top end of the groove 2816, and a bottom end of the protrusion 2400 may be inserted into the groove 2816. The protrusion portion 3400 may be provided in a ring shape generally extending in the up/down direction.

The support protrusion 3402 may be formed at the bottom end of the protrusion portion 3400. A plurality of support protrusions 3402 may be provided. The plurality of support protrusions 3402 may be provided to be spaced apart from each other along a circumference of the protrusion portion 3400. The support protrusion 3402 may be in contact with the bottom surface 2816b of the groove 2816. The support protrusion 3402 may support the filler member 3000 on the bottom surface 2816b of the groove 2816. The bottom end of the protrusion portion 3400 may be spaced apart from the bottom surface 2816b of the groove 2816 in an upward direction by the support protrusion 3402. In addition, a space between the support protrusions 3402 may function as a passage through which the process fluid flows.

The top end of the protrusion portion 3400 may be positioned higher than the top end of the groove 2816. A height from the bottom surface 2814b of the bottom housing 2814 to the bottom surface 2814d of the bottom housing 2814 is defined as a first height h1. A height from the top end of the groove 2816 to the bottom end of the groove 2816 is defined as a second height h2. A height from the top end of the protrusion portion 3400 to the bottom end of the protrusion portion 3400 is defined as a third height h3. In an embodiment, the first height h1 may be higher than the second height h2 and the third height h3, and the third height h3 may be higher than the second height h2.

Accordingly, the protrusion portion 3400 of the filler member 3000 may be provided to be spaced apart from the bottom housing 2814 in an upward direction. The base portion 3200 may be spaced apart from the bottom surface 2814b of the bottom housing 2814 in an upward direction. The protrusion portion 3400 may be spaced apart from the bottom surface 2816b of the groove 2816 in an upward direction. A space between the base portion 3200 and the bottom housing 2814 is provided as a passage through which the process fluid flows.

A space between the protrusion portion 3400 and the bottom surface 2816b of the groove 2816 is provided as a passage through which the process fluid flows.

The protrusion portion 3400 may be spaced apart from an inner surface of the groove 2816. An outer surface of the protrusion portion 3400 may be spaced apart from the inner surface of the groove 2816. In an embodiment, the outer surface of the protrusion portion 3400 may be provided at a position spaced apart from the inner surface of the groove 2816 by a predetermined distance toward the center of the groove 2816. Accordingly, the filler member 3000 may be provided to be spaced apart from the groove 2816. A space between an outer surface of the protrusion portion 3400 and the inner surface of the groove 2816 is provided as a passage through which the process fluid flows.

That is, the passage may be formed between the filler member 3000 and the inner wall of the housing 2810. The passage may allow the process fluid introduced into the buffer space to flow in a direction toward the substrate W as described below.

Figure 5:
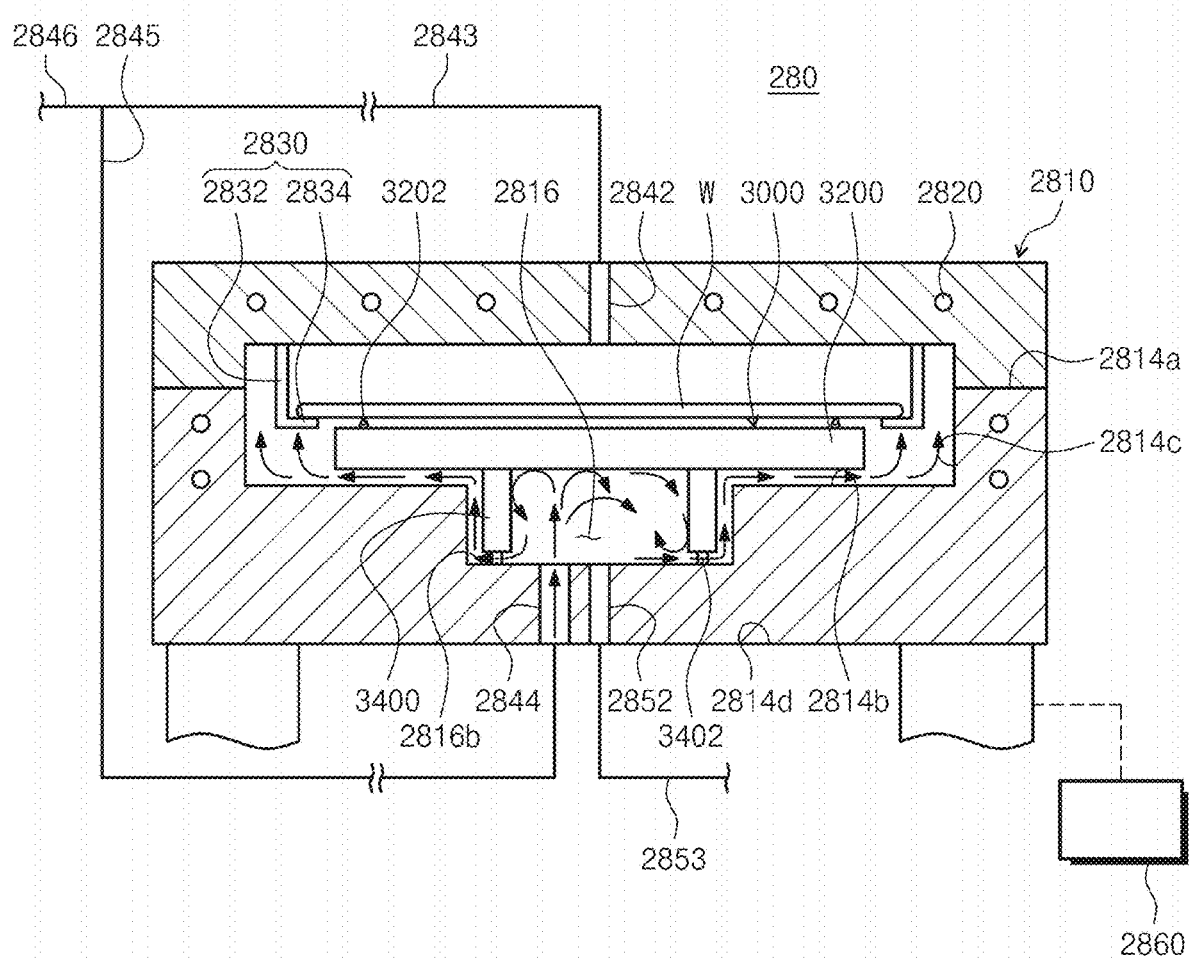
FIG. 5 schematically illustrates a flow of a process fluid in the drying chamber of FIG. 3.

FIG. 5 schematically illustrates a flow of the process fluid in the drying chamber of FIG. 3. Hereinafter, the flow of the process fluid in the housing 2810 will be described in detail with reference to FIG. 5.

The process fluid is supplied from the bottom supply port 2844 to the inside of the housing 2810. The bottom supply port 2844 supplies the process fluid into the groove 2816. The process fluid supplied to the housing 2810 flows into a buffer space formed by the filler member 3000. The process fluid introduced into the buffer space is in contact with the bottom surface of the base portion 3200. The process fluid in contact with the bottom surface of the base portion 3200 flows along the bottom surface of the base portion 3200 and the inner surface of the protrusion portion 3400. Accordingly, a vortex of the process fluid is formed in the buffer space. The process fluid flowing in the buffer space flows into a space formed between the bottom end of the protrusion portion 3400 and the bottom surface 2816b of the groove 2816. That is, the process fluid flowing in the buffer space flows through a first passage, which is a space between the plurality of support protrusions 3402 formed at the bottom end of the protrusion portion 3400. The process fluid flows through the first passage to a second passage, which is a space between an outer surface of the protrusion portion 3400 and the inner surface of the groove 2816. The second passage flows along the outer surface of the ring-shaped protrusion portion 3400 to the bottom surface of the base portion 3200. The process fluid which has passed the second path flows through a third path, which is a space between the bottom surface of the base portion 3200 and the bottom surface 2814b of the bottom housing 2814. The process fluid flowing through the third passage is uniformly supplied into the treating space.

According to an embodiment of the inventive concept described above, the process fluid may uniformly flow in the housing 2810. The process fluid supplied from the bottom supply port 2844 may be induced to primarily flow in the buffer space formed by the filler member 3000. The process fluid which primarily stays in the buffer space may be uniformly distributed over the treating space through the space between the filler member 3000 and the groove 2816. Accordingly, a concentration of the process fluid in the treating space may be resolved.

In addition, it is possible to minimize an asymmetric flow of the process fluid in the treating space due to various members installed inside the housing 2810, or due to space constraints or structural problems. In an embodiment, even if the bottom supply port 2844 is installed eccentrically by a certain distance from a central axis of the housing 2810, the flow of the process fluid can be symmetrically formed inside the treating space. Accordingly, a uniform processing of the substrate W disposed on the treating space may be performed. Furthermore, it is possible to minimize the concentration of the process fluid within the treating space, thereby minimizing an occurrence of large amounts of particles in specific regions of the substrate where the process fluid is supplied relatively more.

In particular, in the semiconductor field which at this time requires a fast throughput, an asymmetry of the process fluid is strengthened if the process fluid is supplied into the housing 2810 at a high speed. Accordingly, according to an embodiment of the inventive concept, even if the process fluid is supplied to the housing 2810 at the high speed, the process fluid may be uniformly supplied to the treating space through the buffer space and the filler member.

A description of the substrate treating apparatus according to another embodiment described below is similar to the description of the substrate treating apparatus according to the above embodiment, except for an additional description, and the redundant description will be omitted.

Figure 6:
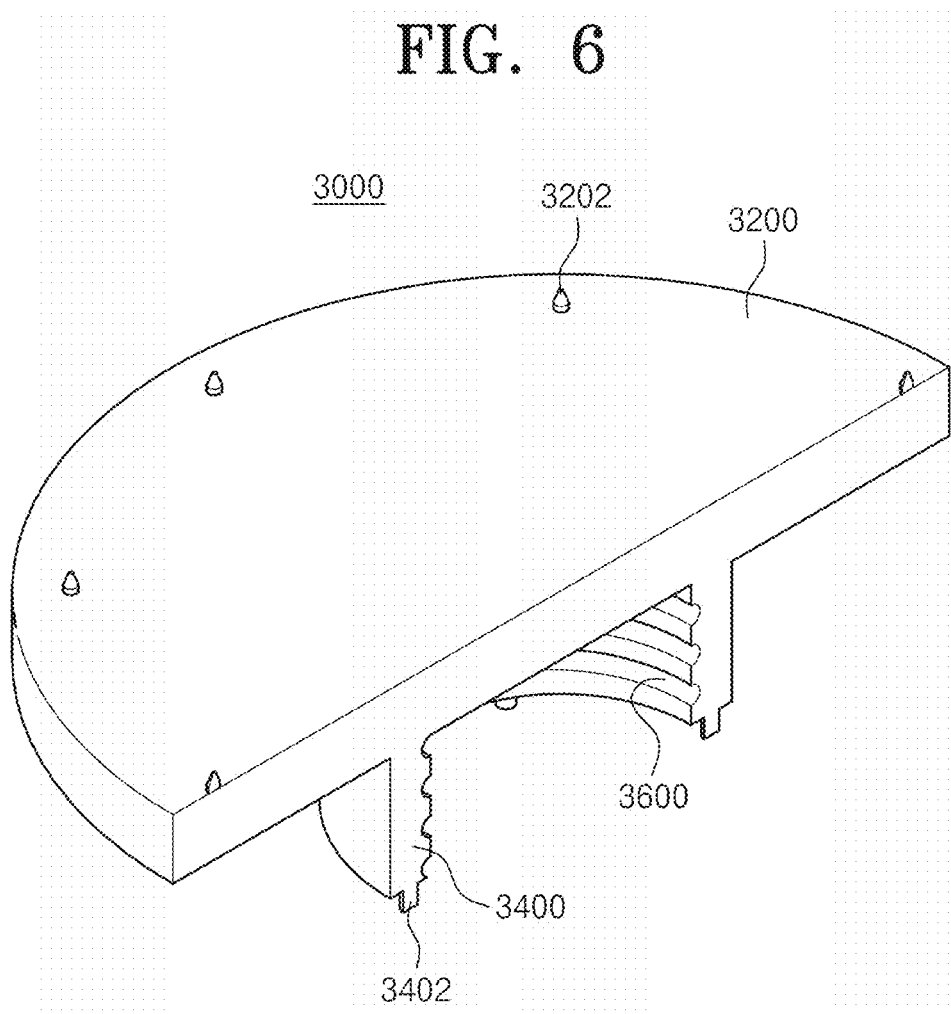
FIG. 6 is a cutting perspective view schematically illustrating another embodiment of the filler member of FIG. 3.

FIG. 6 is a cutting perspective view schematically illustrating another embodiment of the filler member of FIG. 3. Referring to FIG. 6, a slit 3600 may be formed in the filler member 3000 according to an embodiment of the inventive concept. The slit 3600 may be formed in the protrusion portion 3400. The slit 3600 may be formed on the inner surface of the protrusion portion 3400. The slit 3600 may be formed along a circumference of the inner surface of the protrusion portion 3400. In an embodiment, the slit 3600 may be provided in a spiral shape. However, the inventive concept is not limited thereto, and the slit 3600 may be provided transformed into various shapes.

The slit 3600 may form a relatively complex flow direction of the process fluid. Accordingly, the slit 3600 may form a vortex of the process fluid flowing in the buffer space. Accordingly, it is possible to minimize the flow of the process fluid through the first passage disposed in an area adjacent to the bottom supply port 2844. The process fluid supplied from the bottom supply port 2844 flows along the slit 3600 formed in the buffer space, thereby symmetrically flowing into a space formed between the filler member 3000 and the bottom housing 2814.

In the above-described embodiment, the slit 3600 is formed on the inner surface of the protrusion portion 3400, but the inventive concept is not limited thereto. In an embodiment, the slit 3600 may also be formed on the bottom surface of the base portion 3200 positioned above the buffer space.

Figure 7:
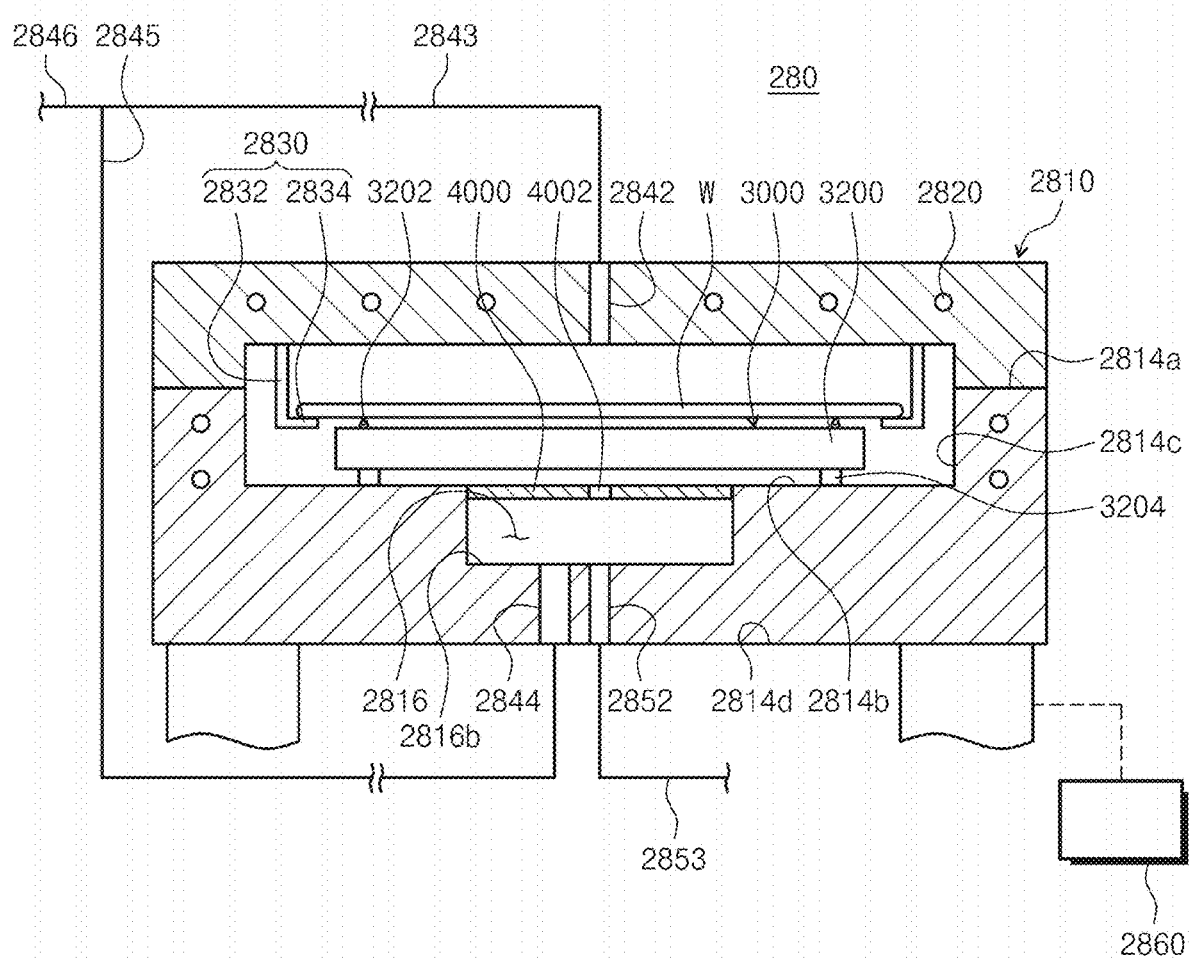
FIG. 7 schematically illustrates another embodiment of the drying chamber of the substrate treating apparatus of FIG. 1.

FIG. 7 schematically illustrates another embodiment of the drying chamber of the substrate treating apparatus of FIG. 1.

Referring to FIG. 7, a drying chamber 280 according to an embodiment of the inventive concept may include a housing 2810, a heating unit 2820, a support unit 2830, a fluid supply unit 2840, a fluid discharge unit 2850, a filler member 3000, and a buffer plate 4000.

The drying chamber 280 according to an embodiment of the inventive concept described below is provided the same as or similar to the housing 2810, the heating unit 2820, the support unit 2830, the fluid supply unit 2840, and the fluid discharge unit 2850 described in FIG. 3. Accordingly, hereinafter, redundant descriptions of similarly provided configurations will be omitted.

The filler member 3000 is disposed inside the treating space. The filler member 3000 may be positioned below the support unit 2830. In an embodiment, if the substrate W is supported by the support unit 2830, the filler member 3000 may be disposed below the substrate W. The filler member 3000 may be provided in a plate shape having a predetermined thickness. In an embodiment, the filler member 3000 may be provided in a disk shape. The filler member 3000 may be provided with an area larger than that of the groove 2816 when viewed from above.

The filler member 3000 has a top surface, a bottom surface, and a side surface. The top surface of the filler member 3000 is positioned to face the bottom surface of the substrate W supported by the support unit 2830. The bottom surface of the filler member 3000 is positioned to face a top surface of a buffer plate 4000 to be described later. The top surface of the filler member 3000 and the bottom surface of the filler member 3000 may be provided with areas corresponding to each other when viewed from above. The top surface and/or the bottom surface of the filler member 3000 may be provided larger than an area of the groove 2816 when viewed from above. A side surface of the filler member 3000 may be formed substantially perpendicular to the ground.

However, the inventive concept is not limited thereto, and the top surface of the filler member 3000 may have a larger area than the bottom surface of the filler member 3000. In addition, the side surface of the filler member 3000 extends from the bottom surface, and is upwardly inclined so that a cross-sectional part of the filler member 3000 gradually increases toward s top end. The bottom surface of the filler member 3000 may be provided larger than the area of the groove 2816 when viewed from above.

The support pin 3202 may be formed on a top surface of the filler member 3000. The support pin 3202 may be in contact with the bottom surface of the substrate W supported by the holder 2834 to separate the substrate W by a predetermined distance in the upward direction. However, the inventive concept is not limited thereto, and the support pin 3202 may not be in contact with the substrate W. The top surface of the substrate W and the top surface of the filler member 3000 may be spaced apart from each other by a predetermined distance by the support pin 3202.

In addition, at least one support pin 3202 may be formed. For example, a plurality of support pins 3202 may be provided. The support pin 3202 may be formed in a top edge region of the base portion 3200. The support fins 3202 may be formed to be spaced apart from each other in the circumferential direction in a top edge region of the base portion 3200 when viewed from above.

A support portion 3204 may be formed on the bottom surface of the filler member 3000. The support portion 3204 may be provided at a position spaced apart from an inner surface of the groove 2816 by a predetermined distance in a direction away from a center of the groove 2816. The support portion 3204 may be formed in a downward direction from the bottom surface of the filler member 3000. The filler member 3000 may be spaced apart from the bottom surface 2814b of the bottom housing 2814 in an upward direction by the support part 3204. The bottom surface of the filler member 3000 may be spaced apart from the bottom surface 2814b of the bottom housing 2814 in an upward direction. The space between is provided as a passage through which the process fluid flows.

The buffer plate 4000 is disposed inside the treating space. The buffer plate 4000 may be positioned below the filler member 3000. The top surface of the buffer plate 4000 may be provided below the bottom surface of the filler member 3000. The buffer plate 4000 may be provided in the groove 2816. In an embodiment, the buffer plate 4000 may be installed in the bottom housing 2814 or may be integrally formed with the bottom housing 2814. The buffer plate 4000 may be provided to correspond to an area of the groove 2816 when viewed from above. The buffer plate 4000 and the groove 2816 may be combined with each other to provide a buffer space therein. In an embodiment, a bottom surface of the buffer plate 4000 and an inner surface of the groove 2816 may be combined with each other to provide a buffer space therein.

An opening 4002 is formed in the buffer plate 4000. The opening 4002 may be formed to vertically penetrate the buffer plate 400000. The opening 4002 may fluidly communicate the treating space and the buffer space with each other. The opening 4002 may be formed in a region including the center of the buffer plate. However, the inventive concept is not limited thereto, and the opening 4002 may be formed along an edge circumferential direction of the buffer plate 4000. In addition, a plurality of openings 4002 may be provided along the edge circumferential direction of the buffer plate 4000 to be formed to be spaced apart from each other. The bottom supply port 2844 described above may be provided at a position which does not overlap the opening 4002 when viewed from above. That is, a region of the buffer plate 4000 facing the process fluid supplied from the bottom supply port 2844 may be a blocking region in which the opening 4002 is not formed. In addition, the above-described exhaust port 2852 may be provided at a position overlapping the opening 4002 when viewed from above.

Figure 8:
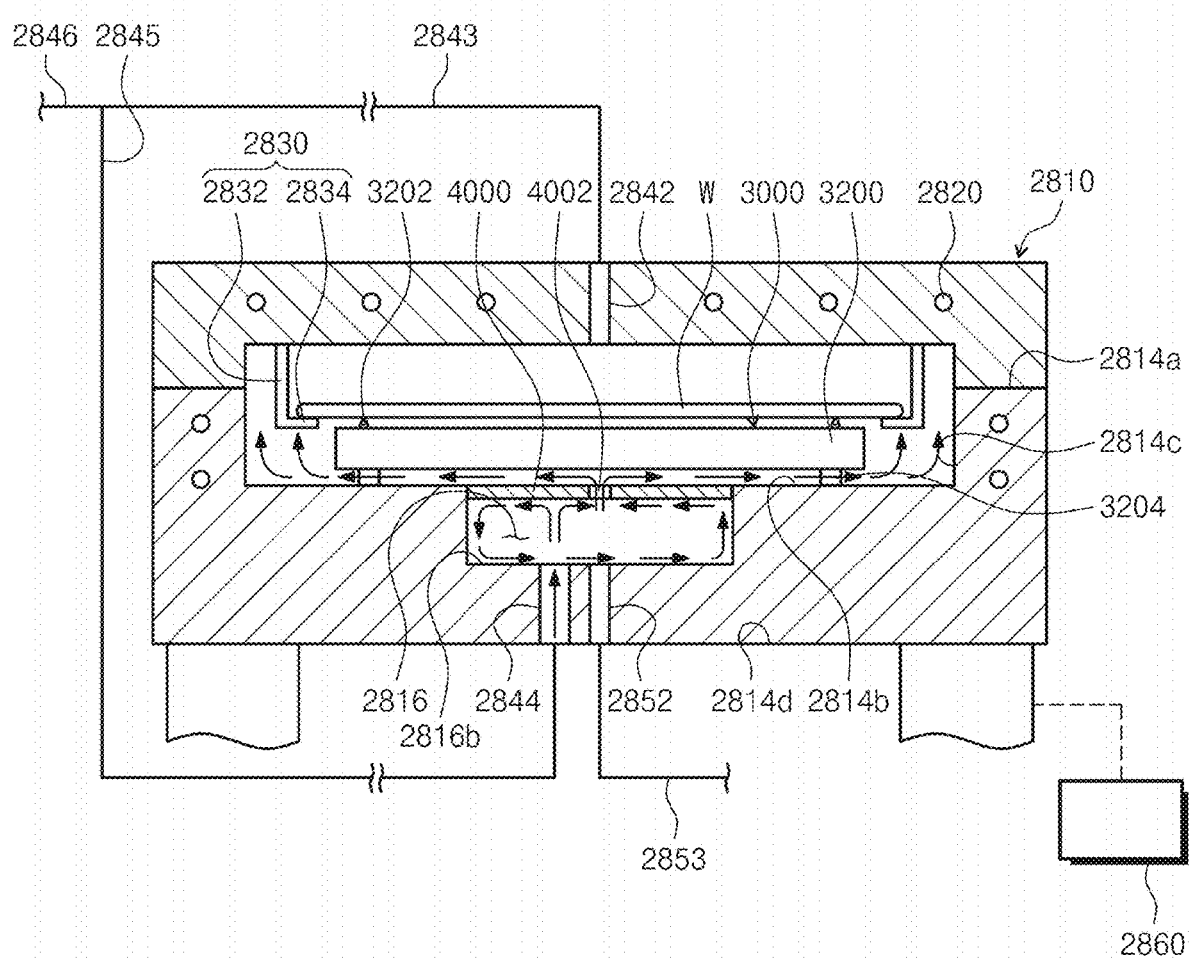
FIG. 8 schematically illustrates a flow of the process fluid in the drying chamber of FIG. 7.

FIG. 8 schematically illustrates a flow of the process fluid in the drying chamber of FIG. 7. The flow of the process fluid inside the housing 2810 will be described in detail with reference to FIG. 8.

The bottom supply port 2844 supplies the process fluid into the housing 2810. The bottom supply port 2844 supplies the process fluid into the groove 2816. The process fluid supplied to the housing 2810 flows into the buffer space formed by the bottom surface of the buffer plate 4000 and the inner surface of the groove 2816. The process fluid introduced into the buffer space contacts the bottom surface of the buffer plate 4000. The process fluid in contact with the bottom surface of the buffer plate 4000 flows along the bottom surface of the buffer plate 4000 and the inner surface of the groove 2816. Accordingly, a vortex of the process fluid is formed in the buffer space. The process fluid flowing in the buffer space flows to the opening 4002 formed in the buffer plate 4000. The process fluid flows through the opening 4002 into the space formed between the bottom surface of the filler member 3000 and the bottom surface 2814b of the bottom housing 2814. The process fluid flowing into the space is uniformly supplied into the treating space.

According to an embodiment of the inventive concept described above, the process fluid may uniformly flow in the housing 2810. The process fluid supplied from the bottom supply port 2844 may be induced to primarily flow in the buffer space formed by the buffer plate 4000. The process fluid that primarily remains in the buffer space may be uniformly distributed onto the treating space through the opening 4002, and a space between the filler member 3000 and the bottom housing 2814. Accordingly, a concentration of the process fluid in the treating space may be resolved.

In addition, it is possible to minimize an asymmetric flow of the process fluid in the treating space due to various members installed inside the housing 2810, or due to space constraints or structural problems. In an embodiment, even if the bottom supply port 2844 is installed eccentrically by a certain distance from a central axis of the housing 2810, the flow of the process fluid can be symmetrically formed inside the treating space. Accordingly, a uniform treatment of the substrate W disposed on the treating space may be performed. Furthermore, it is possible to minimize the concentration of the process fluid within the treating space, thereby minimizing an occurrence of large amounts of particles in specific regions of the substrate at which the process fluid is supplied relatively more.

In particular, in the semiconductor field which at this time requires a fast throughput, an asymmetry of the process fluid is strengthened if the process fluid is supplied into the housing 2810 at a high speed. Accordingly, according to an embodiment of the inventive concept, even if the process fluid is supplied to the housing 2810 at the high speed, the process fluid may be uniformly supplied to the treating space through the buffer space and the filler member.

Figure 9:
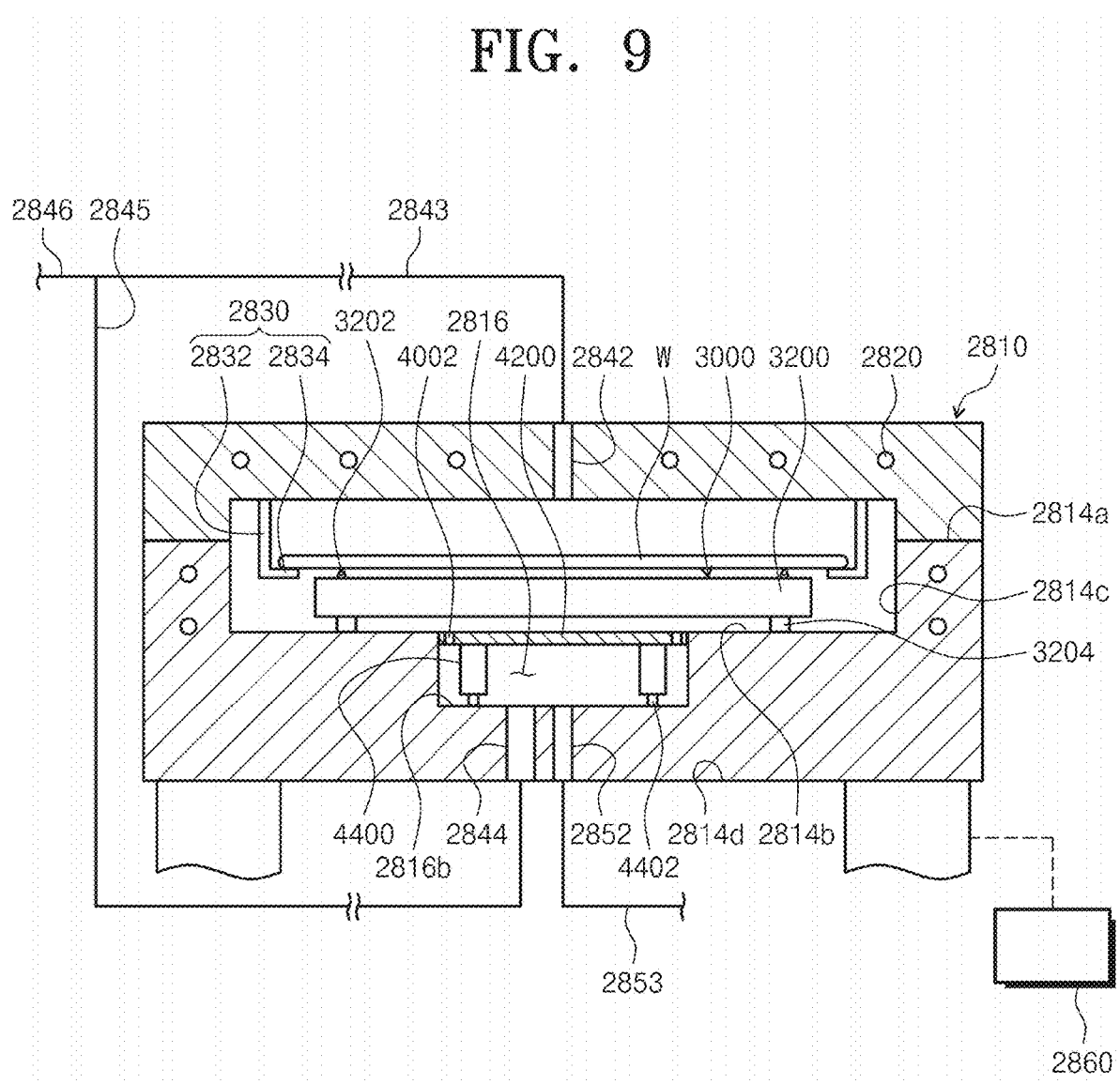
FIG. 9 schematically illustrates another embodiment of the drying chamber of the substrate treating apparatus of FIG. 1.

FIG. 9 schematically illustrates another embodiment of the drying chamber of the substrate treating apparatus of FIG. 1. Referring to FIG. 9, the drying chamber 280 according to an embodiment of the inventive concept described below is mostly provided similar to each other except for the drying chamber 280 according to an embodiment of the inventive concept described with reference to FIG. 7. Hereinafter, the buffer plate 4000 according to an embodiment of the inventive concept will be described in detail.

The buffer plate 4000 is disposed inside the treating space. The buffer plate 4000 may be positioned below the filler member 3000. The buffer plate 4000 may include a body portion 4200 and a leg portion 4400.

A top surface of the body portion 4200 may be provided below the bottom surface of the filler member 3000. The top surface of the body portion 4200 and the bottom surface of the filler member 3000 may be spaced apart from each other. The body portion 4200 may be positioned at a top end of the groove 2816. The body portion 4200 may be provided to correspond to an region of the groove 2816 when viewed from above. The body portion 4200 may be provided in a substantially disk shape. The leg portion 4400 may be provided on a bottom surface of the body portion 4200.

The leg portion 4400 may downwardly extend from the bottom surface of the body portion 4200. The leg portion 4400 may be provided inside the groove 2816. The leg portion 4400 may be provided in a substantially ring shape. A support protrusion 4402 may be formed at a bottom end of the leg portion 4400. A plurality of support protrusions 4402 may be provided. The plurality of support protrusions 4402 may be provided to be spaced apart from each other along a circumference of the leg portion 4400. The support protrusion 4402 may be in contact with the bottom surface 2816b of the groove 2816. The support protrusion 4402 may support the buffer plate 4000 on the bottom surface 2816b of the groove 2816. The bottom end of the leg portion 4400 may be spaced apart from the bottom surface 2816b of the groove 2816 in the upward direction by the support protrusion 4402. The space may function as a first passage through which the process fluid flows.

The leg portion 4400 may be positioned to be spaced apart from the inner surface of the groove 2816. An outer surface of the leg portion 4400 may be spaced apart from the inner surface of the groove 2816. In an embodiment, the outer surface of the leg portion 4400 may be provided at a position spaced apart from the inner surface of the groove 2816 by a predetermined distance toward the center of the groove 2816. The space may function as a second passage through which the process fluid flows.

The buffer plate 4000 may provide a buffer space therein. The body portion 4200 and the leg portion 4400 may be combined with each other to provide the buffer space therein. In an embodiment, a space surrounded by the protrusion portion 4400 at a bottom end of the body 4200 may be the buffer space. The bottom supply port 2844 described above may be positioned to overlap the buffer space. The bottom supply port 2844 may be disposed below the buffer space. In an embodiment, the bottom supply port 2844 may be positioned between an inner surface of the protrusion portions 3400.

An opening 4002 is formed on the top surface of the body portion 4200. The opening 4002 may be formed to vertically penetrate the body portion 4200. The opening 4002 may be formed in an edge region of the body portion 4200. In an embodiment, the opening 4002 may be formed between the outer surface of the leg portion 4400 and an inner surface of the groove 2816 of the bottom housing 2814. The opening 4002 may be formed along a circumferential direction of the body portion 4200. However, this invention is not limited to it, and multiple openings 4002 are provided along an edge circumferential direction of the body portion 4200 to be formed to be spaced apart from each other.

Figure 10:
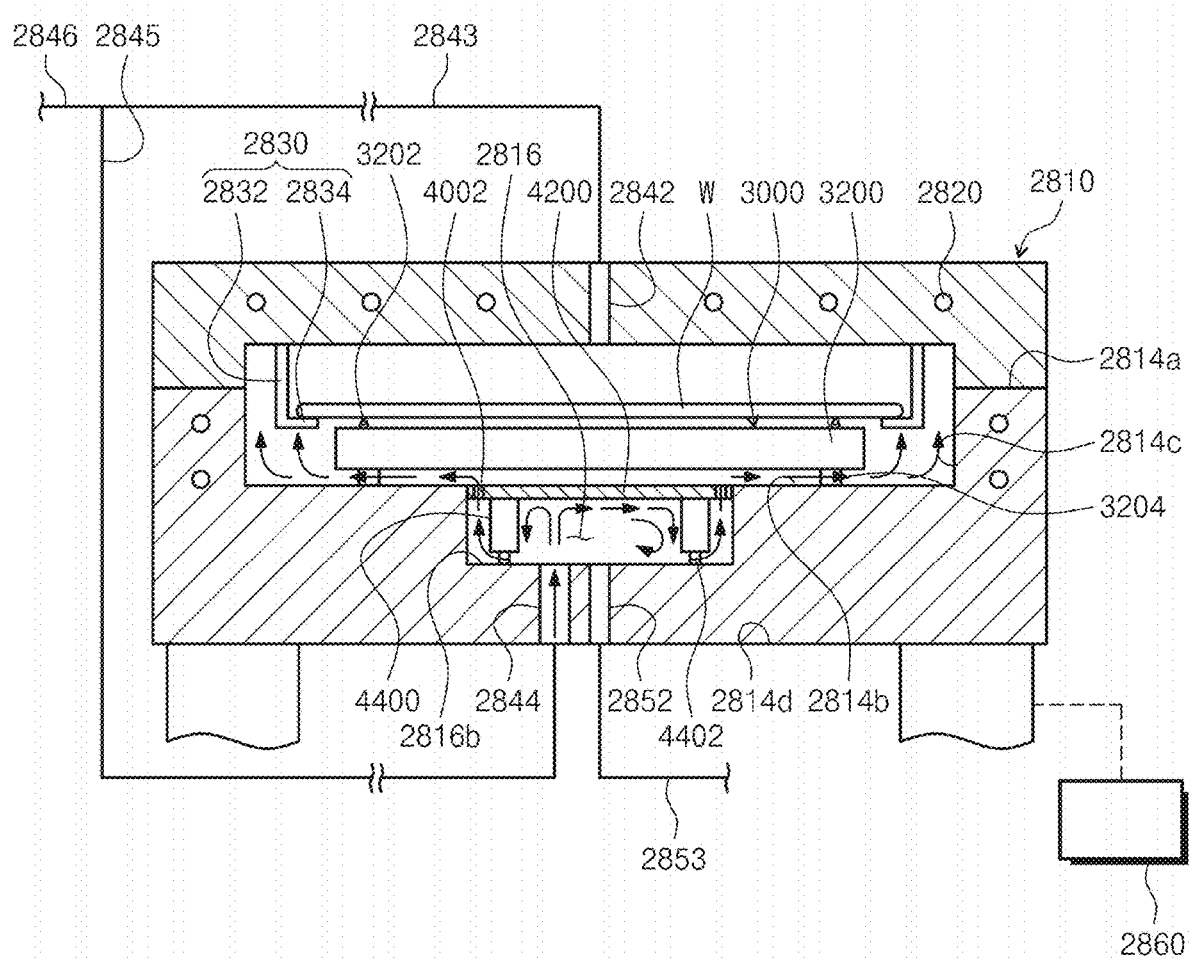
FIG. 10 schematically illustrates a flow of the process fluid in the drying chamber of FIG. 9.

FIG. 10 schematically illustrates a flow of the process fluid in the drying chamber of FIG. 9. The flow of the process fluid inside the housing 2810 will be described in detail with reference to FIG. 10.

The bottom supply port 2844 supplies the process fluid into the housing 2810. The bottom supply port 2844 supplies the process fluid into the groove 2816. The process fluid supplied to the housing 2810 is in contact with the bottom surface of the body portion 4200. The process fluid in contact with the bottom surface of the body portion 4200 flows along the bottom surface of the body portion 4200 and the inner surface of the leg portion 4400. Accordingly, a vortex of the process fluid is formed in the buffer space. The process fluid flowing in the buffer space flows into a space formed between the bottom end of the leg portion 4400 and the bottom surface 2816*b* of the groove 2816. That is, the process fluid flowing in the buffer space flows through the first passage, which is a space between the plurality of support protrusions 4402 formed at the bottom end of the leg portion 4400. The process fluid flows through the first passage to the second passage, which is a space between the outer surface of the leg portion 4400 and the inner surface of the groove 2816. The second passage flows along the outer surface of the ring-shaped leg portion 4400 to the opening 4002 formed in the body portion 4200. The process fluid which has passed through the opening 4002 flows through the third passage, which is a space between the bottom surface of the body part 4200 and the bottom surface 2814*b* of the bottom housing 2814. The process fluid flowing through the third passage is uniformly supplied into the treating space.

According to an embodiment of the inventive concept described above, the process fluid may uniformly flow in the housing 2810. The process fluid supplied from the bottom supply port 2844 may be induced to primarily flow in the buffer space formed by the buffer plate 4000. The process fluid which primarily remains in the buffer space may be uniformly distributed over the treating space through a passage formed between the bottom end of the leg portion 4400 and the bottom surface 2816*b* of the groove 2816, a passage formed between the outer surface of the leg portion 4000 and the inner surface of the groove 2816, and an opening 4002 formed in the body portion 4200. Accordingly, the concentration of the process fluid in the treating space may be resolved.

In addition, it is possible to minimize an asymmetric flow of the process fluid in the treating space due to various members installed inside the housing 2810, or due to space constraints or structural problems. In an embodiment, even if the bottom supply port 2844 is installed eccentrically by a certain distance from the central axis of the housing 2810, the flow of the process fluid can be symmetrically formed inside the treating space. Accordingly, a uniform treatment of the substrate W disposed on the treating space may be performed. Furthermore, it is possible to minimize a concentration of the process fluid within the treating space, thereby minimizing an occurrence of large amounts of particles in a specific region of the substrate at which the process fluid is supplied relatively more.

In particular, in the semiconductor field which at this time requires a fast throughput, the asymmetry of the process fluid is strengthened if the process fluid is supplied into the housing 2810 at a high speed. Accordingly, according to an embodiment of the inventive concept, even if the process fluid is supplied to the housing 2810 at the high speed, the process fluid may be uniformly supplied to the treating space through the buffer space and the filler member.

Figure 11:
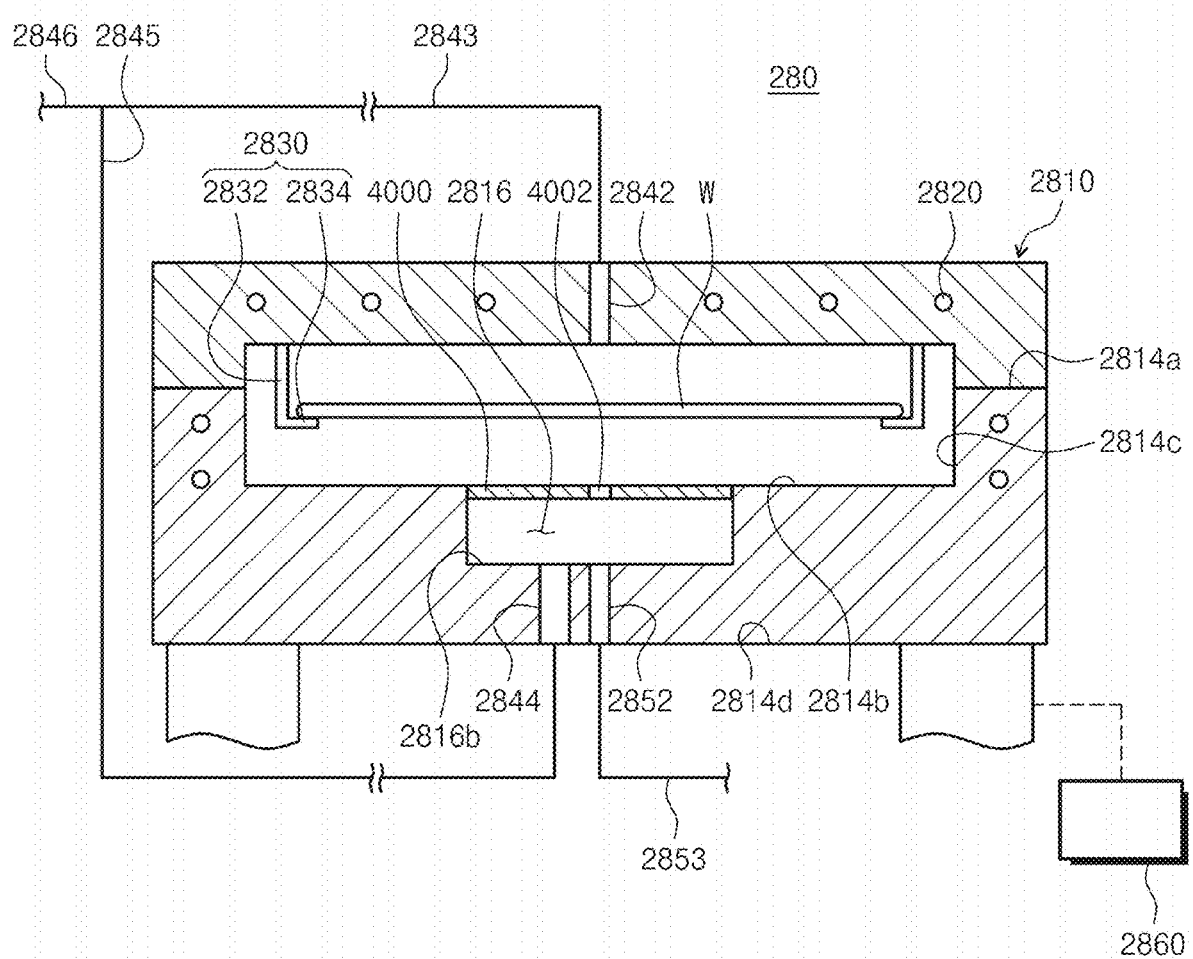
FIG. 11 schematically illustrates another embodiment of the drying chamber of the substrate treating apparatus of FIG. 1.
Figure 12:
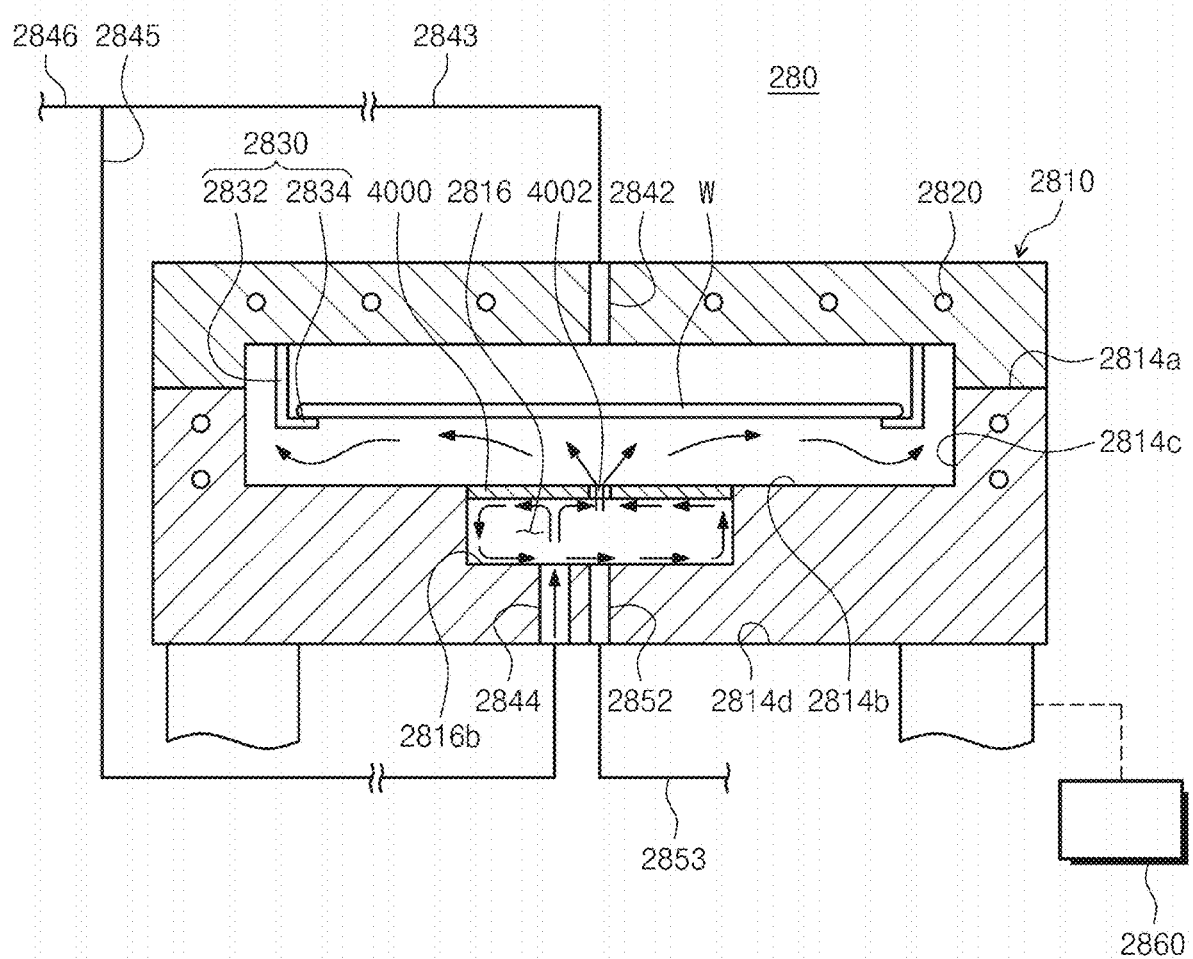
FIG. 12 schematically illustrates a flow of the process fluid in the drying chamber of FIG. 11.

In the above-described example, the filler member 3000 is disposed above the buffer plate 4000 as an example, but is not limited thereto. For example, as illustrated in FIG. 11 and FIG. 12, the filler member 3000 is omitted, and only the buffer plate 4000 may be positioned in the treating space. The buffer plate 4000 may be combined with the bottom housing 2814 to provide a buffer space. In addition, the opening 4002 of the buffer plate 4000 may not overlap the bottom supply port 2844 when viewed from above. That is, a region of the buffer plate 4000 facing the process fluid supplied from the bottom supply port 2844 may be a blocking area. As the buffer plate 4000 is provided, even if the positions of the bottom supply port 2844 and the exhaust port 2852 are changed, a central supply and a central exhaust of the process fluid are possible, and thus there is an advantage in a convenience of design.

In the aforementioned example, the housing 2810 includes a top housing 2812 and a bottom housing 2814, but the inventive concept is not limited to it. For example, as illustrated in FIG. 13, the drying chamber 300 according to another embodiment may include a housing 310, a first supply port 320, a second supply port 330, an exhaust port 340, a first buffer plate 4000*a*, and a second buffer plate 4000*b*.

The housing 310 may include a first housing 312 and a second housing 314. The first housing 312 and the second housing 314 may be combined with each other to form a treating space 311. The first housing 312 may have a cylindrical shape with an open side portion The second housing 314 may be configured to be move in a lateral direction. The second housing 314 may selectively shield the treating space 311. A support member 316 for supporting the substrate W may be installed in the second housing 314. The support member 316 is installed in the second housing 314, and can be inserted into or withdrawn from the treating space 311 as the second housing 314 moves. A flow hole 318 for facilitating a flow of a process fluid in a supercritical state may be formed in the support member 316.

A first groove 312*a* and a second groove 314*b* may be formed in the first housing 312. The first groove 312*a* may be formed on the bottom surface of the first housing 312. The first groove 312*a* may be combined with the first buffer plate 4000*a* to form a first buffer space. In addition, the second groove 312*b* may be formed on a side surface of the first housing 312. The second groove 312*b* may be combined with the second buffer plate 4000*b* to form a second buffer space. A first opening 4002*a* for fluidly communicating the first buffer space and the treating space 311 with each other may be formed in the first buffer plate 4000*a*. In addition, a second opening 4002*b* for fluidly communicating the second buffer space and the treating space 311 may be formed in the second buffer plate 4000*b*.

Figure 13:
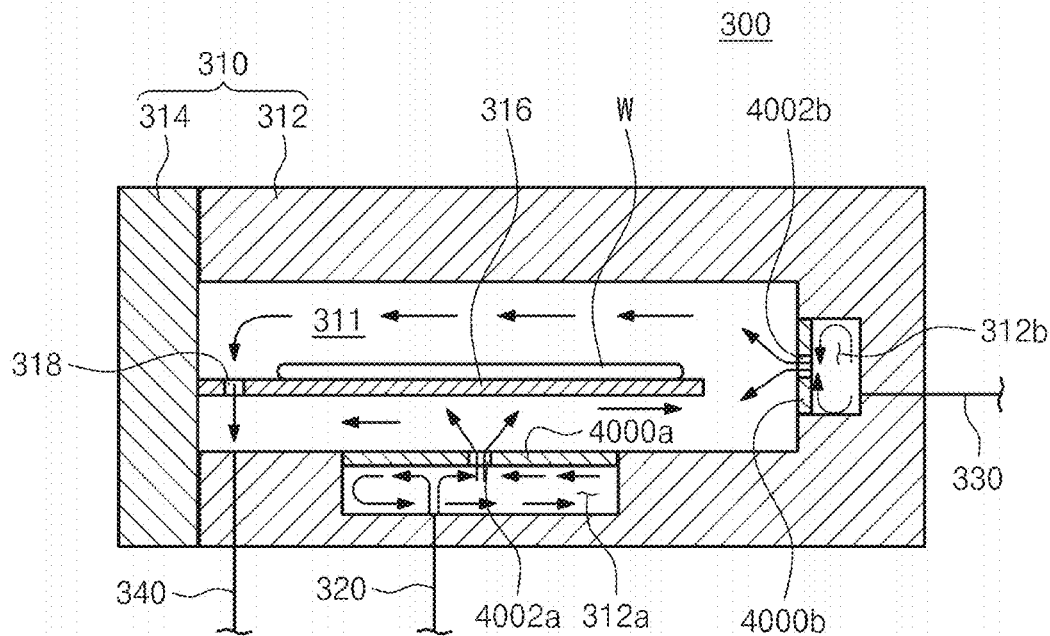
FIG. 13 illustrates another embodiment of the drying chamber of the substrate treating apparatus of FIG. 1.
Figure 14:
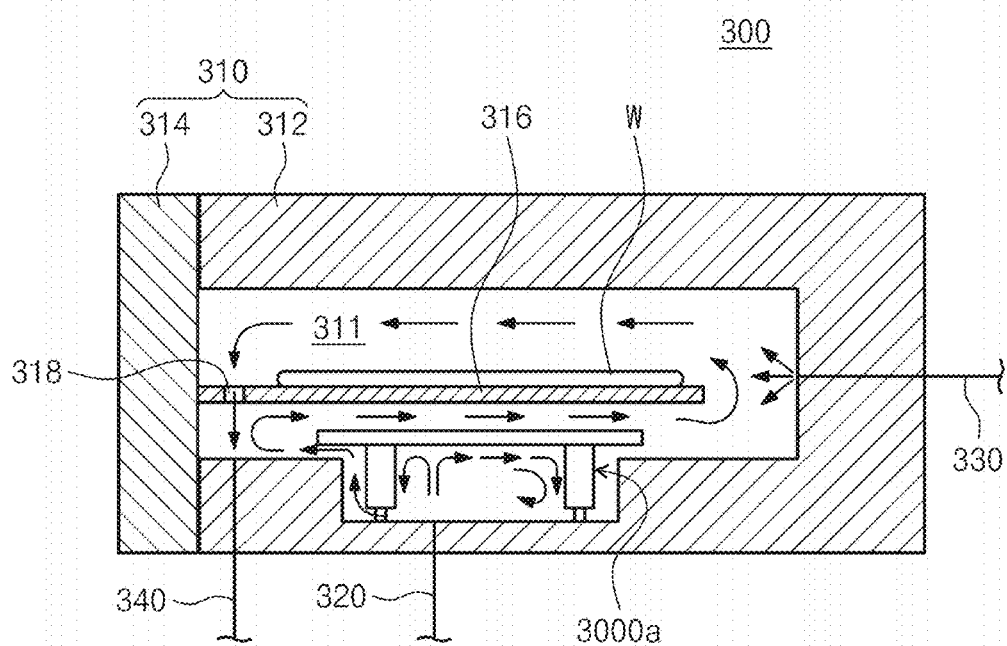
FIG. 14 illustrates another embodiment of the drying chamber of the substrate treating apparatus of FIG. 1.

Although FIG. 13 illustrates that the buffer plate is provided to the housing 310 as an example, the inventive concept is not limited thereto. For example, as illustrated in FIG. 14, a filler member 3000*a* may be provided in the treating space 311 of the housing 310. The buffer space may be formed in the filler member 3000*a*. Since a structure of the filler member 3000*a* is the same as or similar to the structure of the filler member 3000 described above, a repeated description thereof will be omitted.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus comprising:
   a housing for providing a treating space for treating a substrate within;
   a support unit for supporting the substrate in the treating space;
   a bottom supply port for supplying a process fluid to the treating space; and
   a filler member positioned below the substrate supported on the support unit in the treating space, and
   wherein the filler member forms a buffer space facing the bottom supply port,
   wherein a passage is formed between the filler member and an inner wall of the housing and flows the process fluid which is introduced to the buffer space in a direction of the substrate,
   wherein the filler member comprises:
      a base portion; and
      a protrusion portion extending from a bottom surface of the base portion in a downward direction, and
   wherein a slit in a spiral shape is formed along an inner surface along the inner surface of the protrusion portion which defines the buffer space.

2. The substrate treating apparatus of claim 1, wherein the bottom supply port is positioned to overlap the buffer space when seen from above.

3. The substrate treating apparatus of claim 1, wherein the housing includes a top housing and a bottom housing, and
   the top housing forms a groove having an open top, and
   at least a portion of the filler member is inserted into the groove.

4. The substrate treating apparatus of claim 2, wherein the base portion is provided spaced apart from the inner wall of the housing.

5. The substrate treating apparatus of claim 1, wherein at least one support pin is formed at a top surface of the base portion to space apart the substrate from the support unit in a predetermined distance by contacting a bottom surface of the substrate placed on the support unit.

6. The substrate treating apparatus of claim 3, wherein the filler member comprises:
   a base portion; and
   a protrusion portion extending from a bottom surface of the base portion in a downward direction, and
   wherein at least a portion of the protrusion portion is inserted in the groove, and
   the base portion is positioned above the groove and provided larger than an area of the groove when seen from above.

7. The substrate treating apparatus of claim 6, wherein a plurality of support protrusions spaced apart from each other are formed at a bottom end of the protrusion portion, a support protrusion spaces apart the bottom end of the protrusion portion from a bottom surface which defines the groove, and a top end of the protrusion portion is positioned higher than a top end of the groove, and
   a space between the support protrusions is provided as the passage.

8. The substrate treating apparatus of claim 1, wherein the process fluid is a supercritical fluid.

9. A substrate treating apparatus comprising:
   a housing for providing a treating space for treating a substrate within;
   a support unit for supporting the substrate in the treating space;
   a supply port for supplying a process fluid to the treating space; and
   a buffer plate forming a buffer space by coupling together with a groove formed at the housing and having an opening for communicating the treating space and the buffer space.

10. The substrate treating apparatus of claim 9 further comprising a filler member positioned below the substrate supported on the support unit in the treating space, the filler member positioned below the buffer plate.

11. The substrate treating apparatus of claim 10, wherein the housing includes a first housing and a second housing, and the second housing has the groove formed indented in a direction away from the substrate supported on the support unit.

12. The substrate treating apparatus of claim 11, wherein the buffer plate is positioned at the groove, and a region of the buffer plate facing the process fluid supplied from the supply port is a blocking region.

13. The substrate treating apparatus of claim 12, wherein the filler member is provided having an area larger than the groove when seen from above.

14. The substrate treating apparatus of claim 13, wherein a bottom surface of the filler member is provided higher than a top surface of the buffer plate.

15. The substrate treating apparatus of claim 9, wherein the process fluid is a supercritical fluid.

16. A substrate treating apparatus comprising:
   a housing proving a treating space for treating a substrate therein, and including a top housing and a bottom housing having a groove with an open top;
   a support unit for supporting the substrate at the treating space;
   a top supply port for supplying a process fluid from above the treating space;
   a bottom supply port for supplying the process fluid from below or a side of the treating space; and
   a filler member positioned below the substrate supported on the support unit in the treating space,
   wherein the filler member has a buffer space formed facing the bottom supply port, and a passage is formed between the filler member and an inner wall of the housing and flows the process fluid which is introduced to the buffer space by the bottom supply port in a direction of the substrate,
   wherein the filler member comprises:
      a base portion; and
      a protrusion portion extending from a bottom surface of the base portion in a downward direction, and
   wherein a slit in a spiral shape is formed along an inner surface along the inner surface of the protrusion portion which defines the buffer space.

17. The substrate treating apparatus of claim 16,
   wherein the base portion is positioned above the groove and is larger than an area of the groove when seen from above, and wherein the protrusion portion is positioned within the groove, and spaced apart from a side surface of the groove toward a center of the groove.

18. The substrate treating apparatus of claim 17, wherein a support protrusion is formed at a bottom end of the protrusion portion, the bottom end of the protrusion portion is spaced apart from a bottom surface of the groove in an upward direction, and a top end of the protrusion portion is positioned higher than a top end of the groove.

* * * * *